(12) United States Patent
Park et al.

(10) Patent No.: US 12,201,026 B2
(45) Date of Patent: Jan. 14, 2025

(54) LOW FREQUENCY VIBRATING ACTUATOR DEVICE AND LOW FREQUENCY VIBRATING ACTUATOR APPARATUS INCLUDING THE SAME

(71) Applicant: ELECTRONICS AND TELECOMMUNICATIONS RESEARCH INSTITUTE, Daejeon (KR)

(72) Inventors: Kang-Ho Park, Daejeon (KR); Jong Tae Lim, Seoul (KR); Seung Youl Kang, Daejeon (KR); Bock Soon Na, Daejeon (KR); Chan Woo Park, Daejeon (KR); Wooseup Youm, Daejeon (KR); Ji-Young Oh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 768 days.

(21) Appl. No.: 17/493,120

(22) Filed: Oct. 4, 2021

(65) Prior Publication Data

US 2022/0149265 A1 May 12, 2022

(30) Foreign Application Priority Data

Nov. 12, 2020 (KR) .................. 10-2020-0151070
Mar. 8, 2021 (KR) .................. 10-2021-0030094

(51) Int. Cl.
*H10N 30/20* (2023.01)
*H10N 30/00* (2023.01)
*H02N 2/00* (2006.01)

(52) U.S. Cl.
CPC ....... *H10N 30/2044* (2023.02); *H10N 30/704* (2024.05); *H02N 2/006* (2013.01); *H02N 2/007* (2013.01)

(58) Field of Classification Search
CPC .. H10N 30/2044; H10N 30/704; H10N 30/20; H10N 30/50; H02N 2/007; H02N 2/006
See application file for complete search history.

(56) References Cited

U.S. PATENT DOCUMENTS

| 8,487,513 | B2 | 7/2013 | Park et al. |
| 9,445,200 | B2 | 9/2016 | Kim et al. |
| 9,793,463 | B2 | 10/2017 | Son et al. |
| 9,831,415 | B2 | 11/2017 | Park et al. |

(Continued)

FOREIGN PATENT DOCUMENTS

| JP | H0851241 A | 2/1996 |
| JP | H11339561 A | 12/1999 |

(Continued)

*Primary Examiner* — Emily P Pham
(74) *Attorney, Agent, or Firm* — Rabin & Berdo, P.C.

(57) ABSTRACT

Provided is a low frequency vibrating actuator device including an actuator configured to generate a vibration by receiving a voltage, a spring structure disposed on the actuator, and a vibrating mass part disposed on the spring structure. Here, the spring structure includes a first thin-film, a first spacer disposed between the first thin-film and the actuator, and a second spacer disposed between the first thin-film and the vibrating mass part. Also, the first spacer and the second spacer are horizontally offset from each other.

20 Claims, 30 Drawing Sheets

(56) References Cited

U.S. PATENT DOCUMENTS

| | | | |
|---|---|---|---|
| 11,474,343 B2 * | 10/2022 | Raz | ........................ B81B 3/0056 |
| 2013/0041235 A1 | 2/2013 | Rogers et al. | |
| 2020/0130013 A1 | 4/2020 | Park et al. | |
| 2021/0126182 A1 | 4/2021 | Park et al. | |

FOREIGN PATENT DOCUMENTS

| | | | |
|---|---|---|---|
| KR | 20120068613 A | 6/2012 |
| KR | 20140008229 A | 1/2014 |
| KR | 10-2015-0082938 A | 7/2015 |
| KR | 20170040616 A | 4/2017 |
| KR | 10-2026905 B1 | 11/2019 |
| KR | 10-2021-0052152 A | 5/2021 |
| KR | 102282608 B1 | 7/2021 |

* cited by examiner

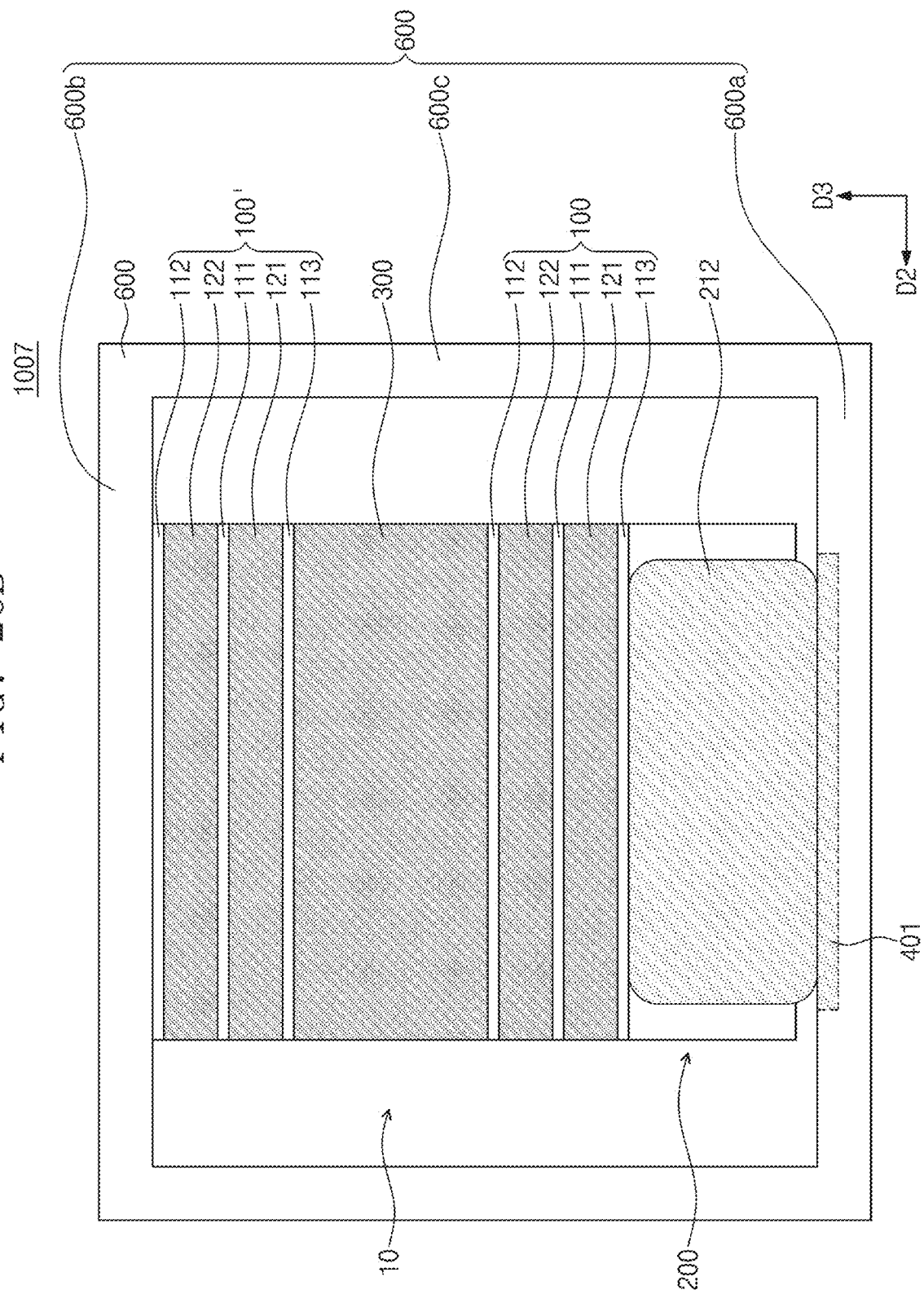

FIG. 22A

| Frequency(Hz) | Displacement(um) | Force(N) |
|---|---|---|
| 191.48 | -3.09 | -0.1806 |
| 192.48 | -5.46 | -0.3590 |
| 193.48 | -1696.85 | -127.75 |
| 194.48 | 4.03 | 0.3566 |
| 195.48 | 1.64 | 0.1767 |

FIG. 22B

| Frequency(Hz) | Displacement(um) | Force(N) |
|---|---|---|
| 392.49 | 65.31 | -3.5658 |
| 393.49 | 130.65 | -7.1580 |
| 394.49 | 33800.98 | -1859.05 |
| 395.49 | 132.05 | 7.2934 |
| 396.49 | 65.96 | 3.6592 |

FIG. 25

| Frequency(Hz) | Displacement(um) | Force(N) |
|---|---|---|
| 230.31 | 7.09 | 0.5764 |
| 231.31 | 14.87 | 1.1870 |
| 232.31 | -11406.25 | -895.42 |
| 233.31 | -16.17 | -1.2507 |
| 234.31 | -8.43 | -0.6426 |

FIG. 26

| Frequency(Hz) | Displacement(um) | Force(N) |
|---|---|---|
| 227.91 | 32.36 | -0.2662 |
| 228.91 | 64.50 | -0.5013 |
| 229.91 | 23354.92 | -170.93 |
| 230.91 | 64.57 | 0.4431 |
| 231.91 | 32.17 | 0.2060 |

LOW FREQUENCY VIBRATING ACTUATOR DEVICE AND LOW FREQUENCY VIBRATING ACTUATOR APPARATUS INCLUDING THE SAME

CROSS-REFERENCE TO RELATED APPLICATIONS

This U.S. non-provisional patent application claims priority under 35 U.S.C. § 119 of Korean Patent Application Nos. 10-2020-0151070, filed on Nov. 12, 2020, and 10-2021-0030094, filed on Mar. 8, 2021, the entire contents of which are hereby incorporated by reference.

BACKGROUND

The present disclosure herein relates to a low frequency vibrating actuator device and a low frequency vibrating actuator apparatus including the same, and more particularly, to a low frequency vibrating actuator device including a spring structure and a low frequency vibrating actuator apparatus including the same.

In general, a vibrating actuator device may be an actuator device generating and transmitting a vibration by using, e.g., an electric motor, a piezoelectric device, an electrostrictive device, and a capacitive device. The vibrating actuator device may perform a function of transmitting a vibration to a finger tip, a skin, and a tissue in a body of a human. A low frequency vibrating actuator device that provides a low frequency vibration sensible by a human may be applied to various technological and industrial fields such as a touch screen, a tactile display, an augmented reality(AR)/virtual reality(VR)/mixed reality(MR) field, and bio-diagnosis as well as a band-type, patch-type, wearing-type, mask-type, or helmet-type skin care vibration stimulating array apparatus that performs a function of providing a vibration stimulating massage to a skin.

SUMMARY

The present disclosure provides a low frequency vibrating actuator device that outputs a low frequency sensible by a human and a low frequency vibrating actuator apparatus including the same.

The object of the present invention is not limited to the aforesaid, but other objects not described herein will be clearly understood by those skilled in the art from descriptions below.

An embodiment of the inventive concept provides a low frequency vibrating actuator device including: an actuator configured to generate a vibration by receiving a voltage; a spring structure disposed on the actuator; and a vibrating mass part disposed on the spring structure. Here, the spring structure includes: a first thin-film; a first spacer disposed between the first thin-film and the actuator; and a second spacer disposed between the first thin-film and the vibrating mass part. Also, the first spacer and the second spacer are horizontally offset from each other.

In an embodiment of the inventive concept, a low frequency vibrating actuator apparatus includes: a substrate; and at least one low frequency vibrating actuator device disposed on the substrate. Here, the low frequency vibrating actuator device includes: an actuator configured to generate a vibration by receiving a voltage; a first spring structure disposed on the actuator; and a vibrating mass part disposed on the first spring structure. Also, the first spring structure includes: a first thin-film; a first spacer disposed between the first thin-film and the actuator; and a second spacer disposed between the first thin-film and the vibrating mass part. Here, the first spacer and the second spacer are horizontally offset from each other.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings:

FIGS. 20A and 20B are a plan view and a side view illustrating a low frequency vibrating actuator apparatus according to the embodiments of the inventive concept;

FIGS. 22A and 22B each show a result obtained by analyzing a traction force of a spring structure and a vibration displacement of a vibrating mass part around a resonance frequency when a voltage is applied to the low frequency vibrating actuator device by using a finite element analysis method in an experimental example 1;

FIG. 25 shows a result obtained by analyzing a traction force of a spring structure and a vibration displacement of a vibrating mass part around a resonance frequency when a voltage is applied to the low frequency vibrating actuator device by using a finite element analysis method in an experimental example 3;

FIG. 26 shows a result obtained by analyzing a traction force of a spring structure and a vibration displacement of a vibrating mass part around a resonance frequency when a voltage is applied to the low frequency vibrating actuator device by using a finite element analysis method in an experimental example 4.

DETAILED DESCRIPTION

Figure 1:
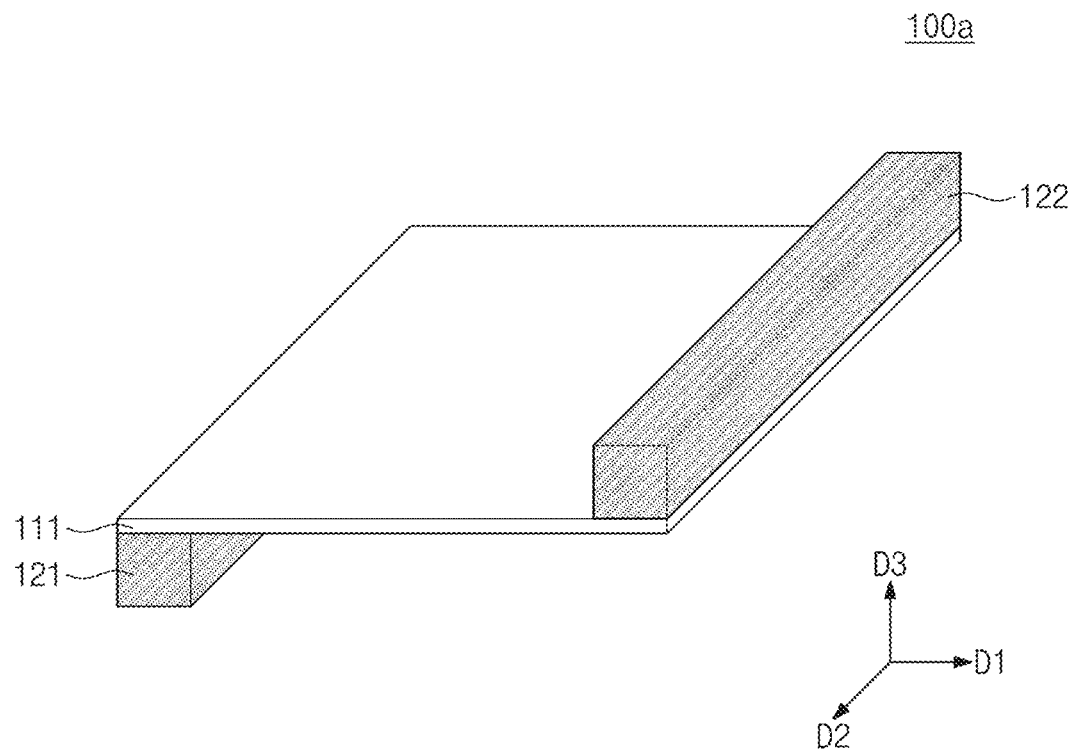
FIGS. 1 to 5 are perspective views illustrating spring structures according to embodiments of the inventive concept.

The present invention may be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. In addition, the sizes of the elements and the relative sizes between elements may be exaggerated for further understanding of the present invention.

In the following description, the technical terms are used only for explaining a specific exemplary embodiment while not limiting the present disclosure. Unless terms used in embodiments of the present invention are differently defined, the terms may be construed as meanings that are commonly known to a person skilled in the art.

In the following description, the technical terms are used only for explaining a specific exemplary embodiment while not limiting the present disclosure. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

It will also be understood that when a layer is referred to as being "on" another layer or substrate, it can be directly on the other layer or substrate, or intervening layers may also be present.

It will be understood that although the terms first and second are used herein to describe various elements, these elements should not be limited by these terms. These terms are used only to discriminate one region or layer from another region or layer. Therefore, a portion referred to as a first portion in one embodiment can be referred to as a second portion in another embodiment. An embodiment described and exemplified herein includes a complementary embodiment thereof. Like reference numerals refer to like elements throughout.

FIGS. 1 to 5 are perspective views illustrating a spring structure according to embodiments of the inventive concept.

Referring to FIG. 1, a spring structure 100a may include a first thin-film 111, a first spacer 121, and a second spacer 122. The first spacer 121 may be disposed on a bottom surface of the first thin-film 111. The second spacer 122 may be disposed on a top surface of the first thin-film 111. The first spacer 121 and the second spacer 122 may be horizontally offset. In other words, the first spacer 121 may be disposed adjacent to one side surface of the first thin-film 111, and the second spacer 122 may be disposed adjacent to the other side surface, which is opposite to the one side surface, of the first thin-film 111. Each of the first spacer 121 and the second spacer 122 may contact an edge of the first thin-film 111. The first spacer 121 and the second spacer 122 may each have a bar shape extending in a second direction D2 and be parallel to each other.

Figure 2:
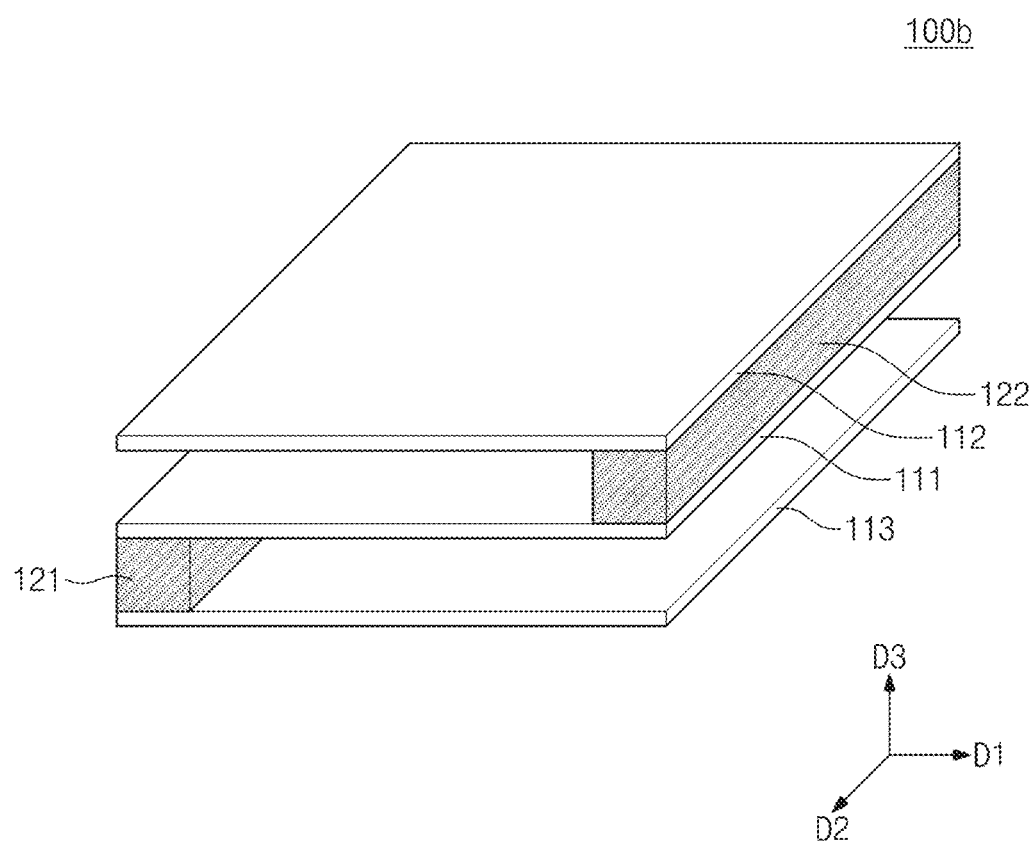

Referring to FIG. 2, a spring structure 100b may include a first thin-film 111, a second thin-film 112, a third thin-film 113, a first spacer 121, and a second spacer 122. The second thin-film 112 may be provided on the second spacer 122 of the spring structure 100a described with reference to FIG. 1, and the third thin-film 113 may be provided below the first spacer 121. The first spacer 121 may be disposed adjacent to one side surface of the third thin-film 113. The second spacer 122 may be disposed adjacent to one side surface of the second thin-film 112. The first to third thin-films 111, 112, and 113 may be parallel to each other.

Figure 3:
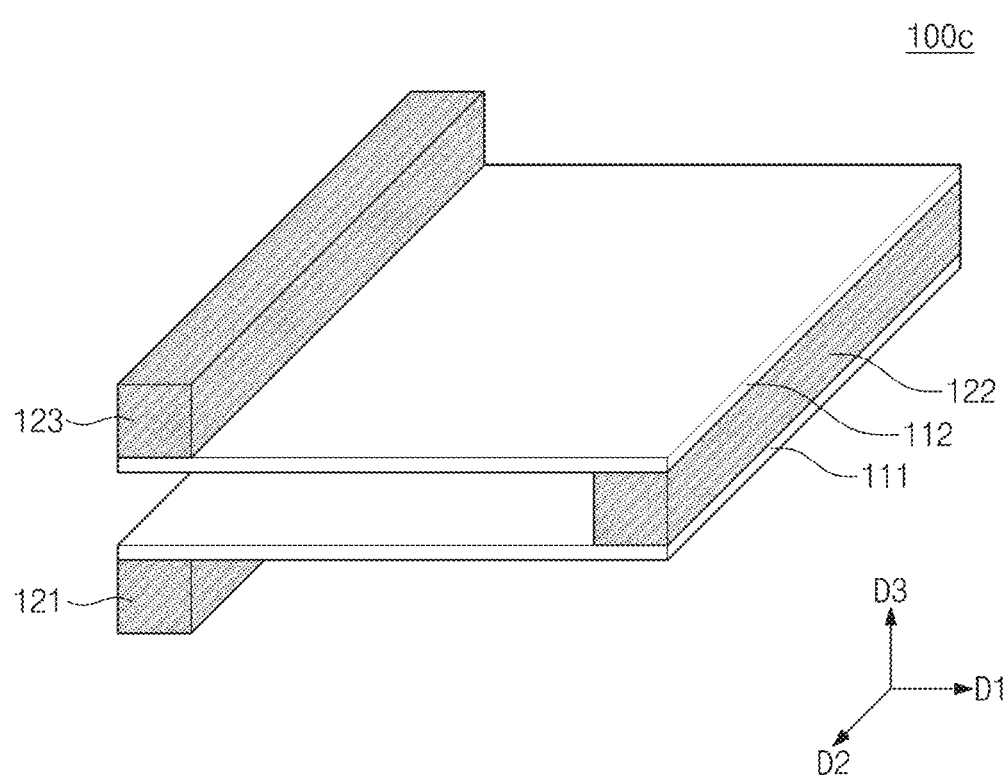

Referring to FIG. 3, a spring structure 100c may include a first thin-film 111, a second thin-film 112, a first spacer 121, a second spacer 122, and a third spacer 123. The second thin-film 112 may be provided on the second spacer 122 of the spring structure 100a described with reference to FIG. 1. The third spacer 123 may be disposed on a top surface of the second thin-film 112. The third spacer 123 may be disposed adjacent to one side surface of the second thin-film 113, and the second spacer 122 may be disposed adjacent the other side surface of the second thin-film 112. For example, the third spacer 123 may vertically overlap the first spacer 121 and be horizontally offset from the second spacer 122. The first thin-film 111 and the second thin-film 112 may be parallel to each other. The first to third spacers 121, 122, and 123 may be parallel to each other. The third spacer 123 may contact an edge of the second thin-film 112. The third spacer 123 may have a bar shape extending in the second direction D2.

Figure 4:
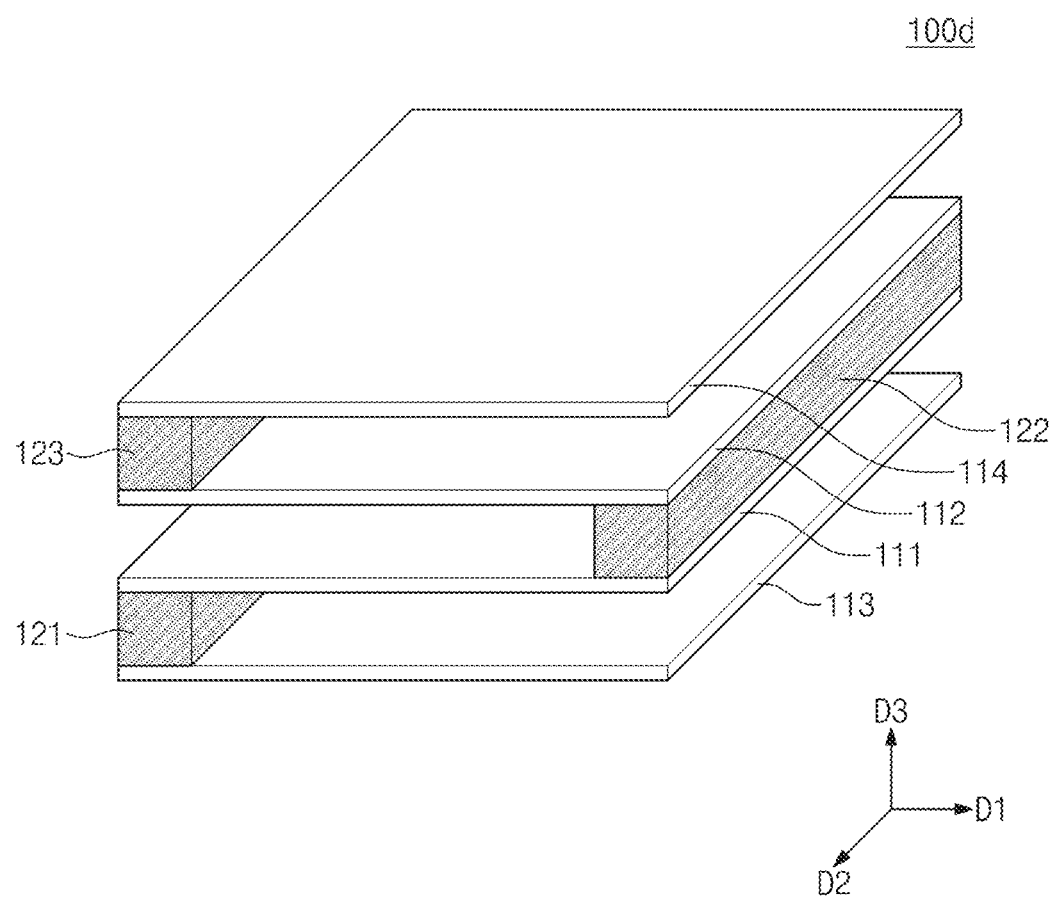

Referring to FIG. 4, a spring structure 100d may include a first thin-film 111, a second thin-film 112, a third thin-film 113, a fourth thin-film 114, a first spacer 121, a second spacer 122, and a third spacer 123. The third thin-film 113 may be provided below the first spacer 121 of the spring structure 100c described with reference to FIG. 3, and the fourth thin-film 114 may be provided on the third spacer 123. The first spacer 121 may be disposed adjacent to one side surface of the third thin-film 113. The third spacer 123 may be disposed adjacent to one side surface of the fourth thin-film 114. The first to fourth thin-films 111, 112, 113, and 114 may be parallel to each other.

Each of the first thin-film 111, the second thin-film 112, the third thin-film 113, the fourth thin-film 114, the first spacer 121, the second spacer 122, and the third spacer 123, which are described with reference to FIGS. 1 to 4, may include, e.g., a metal material having a high rigidity. For example, each of the first to fourth thin-films 111, 112, 113, and 114 and the first to third spacers 121, 122, and 123 may include at least one metal material of iron (Fe), aluminum (Al), copper (Cu), titanium (Ti), cobalt (Co), nickel (Ni), zinc (Zn), molybdenum (Mo), tungsten (W), and tantalum (Ta). For example, each of the first to fourth thin-films 111, 112, 113, and 114 and the first to third spacers 121, 122, and 123 may include at least one alloy of stainless and tungsten carbide (WC). For another example, each of the first to fourth thin-films 111, 112, 113, and 114 and the first to third spacers 121, 122, and 123 may include an organic material having high rigidity and elasticity. For example, each of the first to fourth thin-films 111, 112, 113, and 114 and the first to third spacers 121, 122, and 123 may include at least one organic material of polyimide (PI), polycarbonate (PC), a curing resin, and an epoxy. For another example, each of the first to fourth thin-films 111, 112, 113, and 114 and the first to third spacers 121, 122, and 123 may include a semiconductor material or ceramic material having high rigidity and elasticity. However, the embodiment of the inventive concept is not limited to the above-described materials. The first to fourth thin-films 111, 112, 113, and 114 and the first to third spacers 121, 122, and 123 may include the same material as each other. The first to fourth thin-films 111, 112, 113, and 114 and the first to third spacers 121, 122, and 123 may include the different materials from each other.

Each of the first to fourth thin-films 111, 112, 113, and 114 may have a thickness, a width, a shape, and a depth, which are not limited to the illustrations in the drawings. For example, each of the first to fourth thin-films 111, 112, 113, and 114 may have various shapes such as a square shape, a rectangular shape, a triangular shape, a circular shape, and an oval shape and have the same thickness, width, and depth as each other.

Each of the first to third spacers 121, 122, and 123 may have a thickness, a length, and a width, which are not limited to the illustrations in the drawings. For example, the first to third spacers 121, 122, and 123 may have the same thickness, length, and width as each other or different thicknesses, lengths, and widths from each other.

Figure 5:
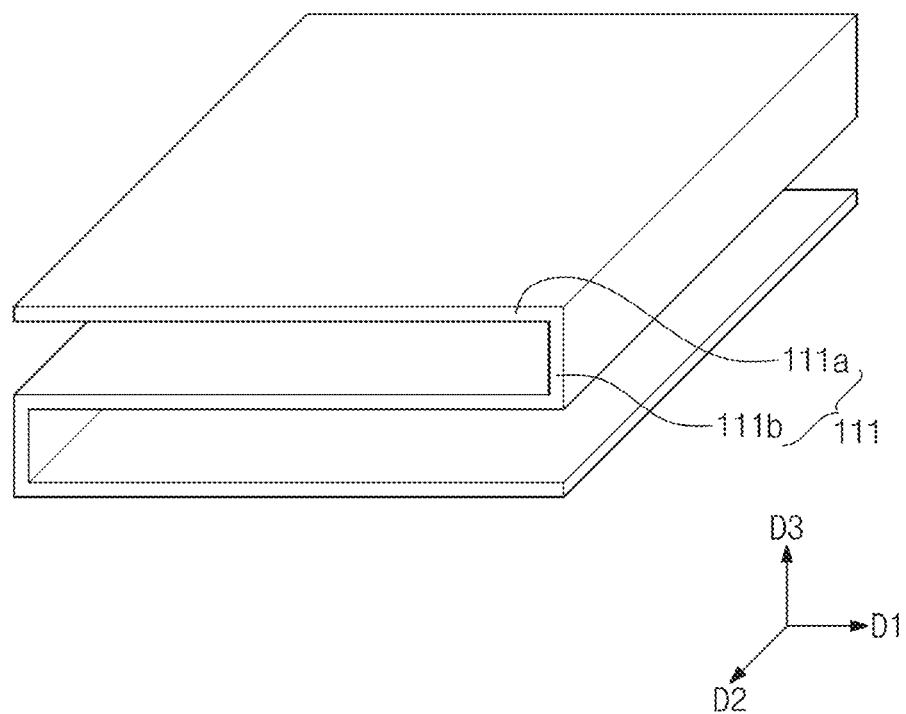

Referring to FIG. 5, a spring structure 100e may have a shape in which a first thin-film 111 is bent into an S-shape. The first thin-film 111 may include thin-film parts 111a and spacer parts 111b. Each of the thin-film parts 111a may be a portion extending in a horizontal direction, and each of the spacer parts 111b may be a portion extending in a vertical direction. The spacer part 111b may connect the thin-film parts 111a that are adjacent to each other. This embodiment is substantially the same as that the first spacer 121 and the second spacer 122 are integrated with the first to third thin-films 111, 112, and 113. The first thin-film 111 may have a thickness and a width that are changed instead of being limited to the illustrations in the drawings.

Figure 6:
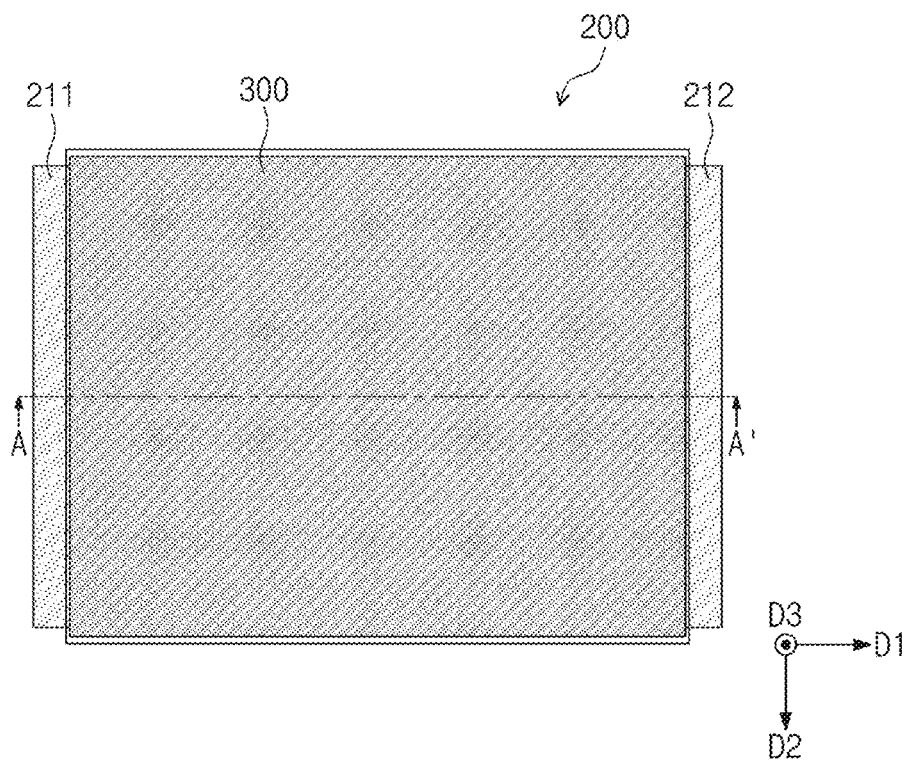
FIG. 6 is a plan view illustrating a low frequency vibrating actuator device according to the embodiments of the inventive concept.
Figure 7A:
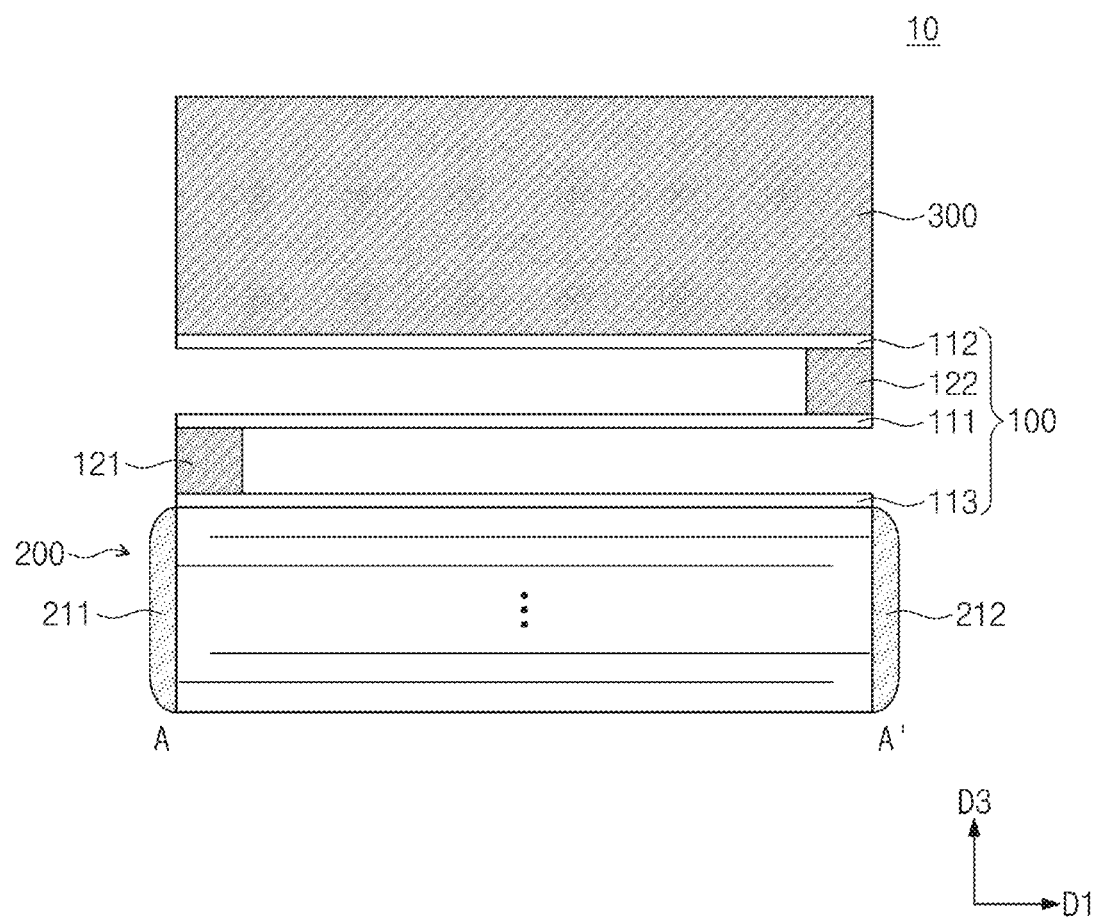
FIG. 7A is a cross-sectional view taken along the line A-A' of FIG. 6.
Figure 7B:
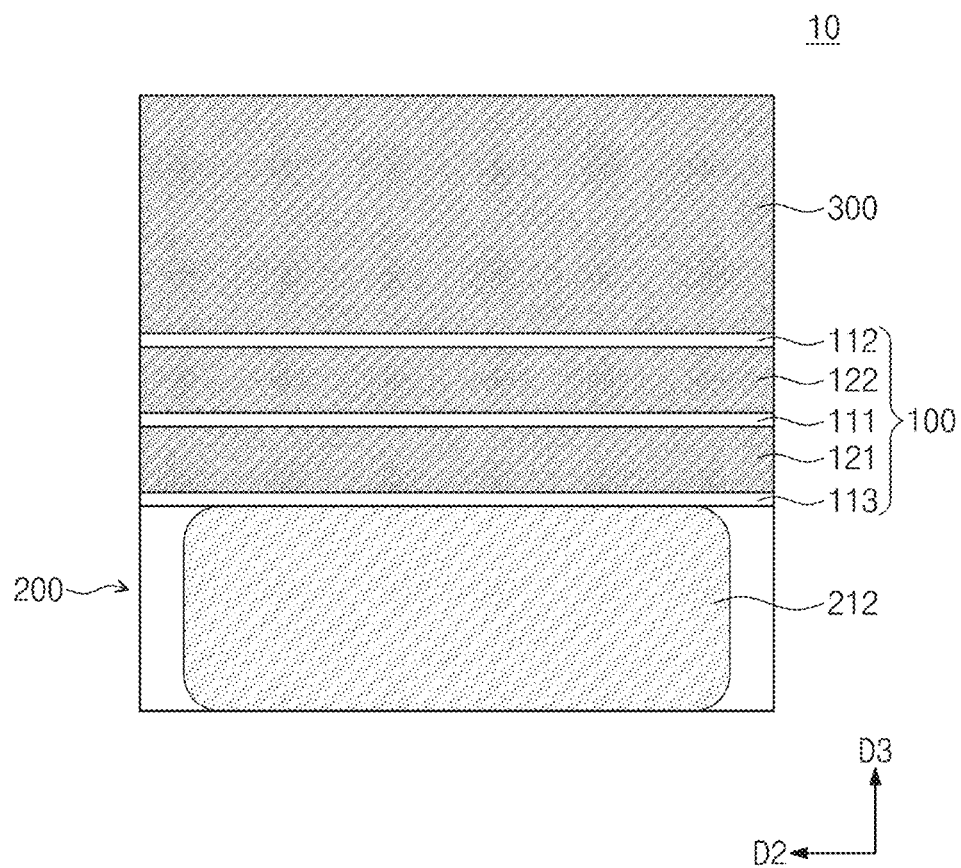
FIG. 7B is a side view illustrating a side surface of the low frequency vibrating actuator of FIG. 6.

FIG. 6 is a plan view illustrating a low frequency vibrating actuator device according to the embodiments of the inventive concept. FIG. 7A is a cross-sectional view taken along the line A-A' of FIG. 6. FIG. 7B is a side view illustrating a side surface of the low frequency vibrating actuator of FIG. 6.

Referring to FIGS. 6, 7A, and 7B, a low frequency vibrating actuator device 10 may include an actuator 200, a spring structure 100, and a vibrating mass part 300. The spring structure 100 may be disposed on the actuator 200. The vibrating mass part 300 may be disposed on the spring structure 100. That is, the spring structure 100 may be disposed between the actuator 200 and the vibrating mass part 300. The first spacer 121 may be disposed between the first thin-film 111 and the actuator 200, and the second spacer 122 may be disposed between the first thin-film 111 and the vibrating mass part 300.

The spring structure 100 may be one of the spring structures 100a, 100b, 100c, 100d, and 100e described with reference to FIGS. 1 to 5. For example, the spring structure 100 may have a structure of the spring structure 100b described in FIG. 2. In this case, the third thin-film 113 may contact a top surface of the actuator 200, and the second thin-film 112 may contact a bottom surface of the vibrating mass part 300. For another example, when the spring structure 100 has a structure of the spring structure 100a described in FIG. 1, the first spacer 121 may contact the top surface of the actuator 200, and the second spacer 122 may contact the bottom surface of the vibrating mass part 300.

Figure 8:
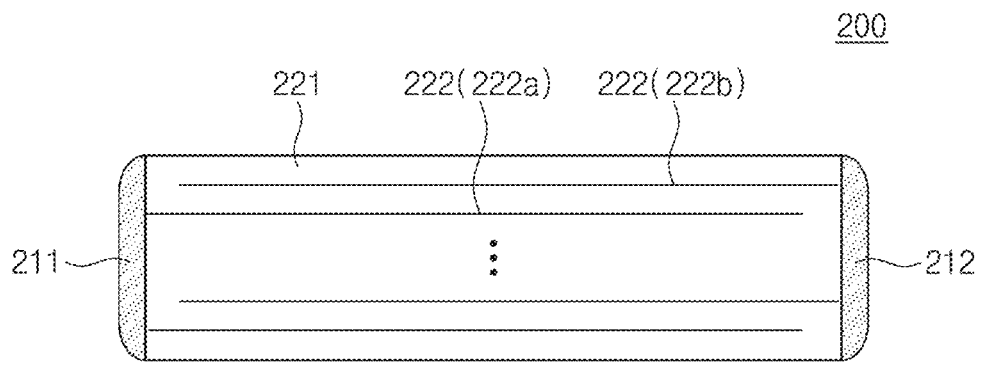
FIG. 8 is a cross-sectional view illustrating the inside of the low frequency vibrating actuator device according to the embodiments of the inventive concept.

FIG. 8 is a cross-sectional view illustrating the inside of the low frequency vibrating actuator device according to the embodiments of the inventive concept.

Referring to FIG. 8, the actuator 200 may include a first side electrode 211, a second side electrode 212, a plurality of insulation layers 221, and a plurality of internal electrodes 222.

The insulation layers 221 may be laminated. In other words, the insulation layers 221 may be laminated in a third direction D3. The insulation layers 221 may include at least one of a piezoelectric device or an electrostrictive device. Each of the insulation layers 221 may be a piezoelectric thin-film. For example, each of the insulation layers 221 may include at least one of PZT, PLZT, PMN-PT, PYN-PT, PIN-PT, ZnO, CdS, AlN, BaTiO$_3$, PbTiO$_3$, LiNbO$_3$, LiTaO$_3$, BNT, PVDF, P(DVF-TrFE), P(VDF-TrFE-CFE), P(VDF-TrFE-CTFE), P(VDF-HFP), PVDF-TFE, PVC, PAN, PPEN, or polyamide. However, the embodiment of the inventive concept is not limited to the above-described materials. As the insulation layers 221 are integrated with each other, a boundary surface is not provided between the insulation layers 221 adjacent to each other. For another example, unlike as illustrated, the boundary surface may be provided between the insulation layers 221 adjacent to each other.

The first side electrode 211 and the second side electrode 212 may be respectively disposed on both sidewalls of the insulation layers 221. The first side electrode 211 and the second side electrode 212 may be respectively provided along the both sidewalls of the insulation layers 221. The first side electrode 211 and the second side electrode 212 may be spaced apart from each other in a first direction D1.

The internal electrodes 222 may include at least one first internal electrode 222a electrically connected with the first side electrode 211 and at least one second internal electrode 222b electrically connected with the second side electrode 212. The first internal electrode 222a and the second internal electrode 222b may be alternately laminated with each other. The first internal electrode 222a and the second internal electrode 222b may be spaced apart from each other in the third direction D3. Each of the first and second side electrodes 211 and 212 and the internal electrodes 222 may include at least one metal material of silver (Ag), palladium (Pd), platinum (Pt), nickel (Ni), copper (Cu), titanium (Ti), gold (Au), and tin (Sn). However, the embodiment of the inventive concept is not limited to the above-described materials.

As an alternating current voltage is applied between the first side electrode 211 and the second side electrode 212, the actuator 200 may vibrate, a generated vibration may be transmitted to the vibrating mass part 300 through the spring structure 100 disposed on the actuator 200, and finally the vibrating mass part 300 may vibrate.

Referring to FIGS. 6, 7A, and 7B again, the vibrating mass part 300 may be disposed on the spring structure 100. For example, the vibrating mass part 300 may include at least one of a metal material or an alloy having a high rigidity, an organic material, a ceramic material or a semiconductor material having a high rigidity and elasticity. However, the embodiment of the inventive concept is not limited to the above-described materials. For example, the vibrating mass part 300 may include the same material as the first to fourth thin-films 111, 112, 113, and 114 and the first to third spacers 121, 122, and 123. For example, the vibrating mass part 300 may include a different material from the first to fourth thin-films 111, 112, 113, and 114 and the first to third spacers 121, 122, and 123.

The vibrating mass part 300 may have a thickness, a width, a height, and a shape, which are not limited to the illustrations in the drawings. The vibrating mass part 300 may have various shapes such as a cylinder, an elliptical cylinder, a rectangular cylinder, and a triangular cylinder.

Since the actuator 200 has a resonance frequency of several tens to several hundreds kHz, the actuator 200 generates a vibration that is not sensed by a human. As the spring structure 100 and the vibrating mass part 300 are provided on the actuator 200, the low frequency vibrating actuator device 10 may have a resonance frequency in a range from about 100 Hz to about 500 Hz. In other words, as the spring structure 100 and the vibrating mass part 300 are provided, a low frequency vibration that is sensible by a human may be generated. The vibrating mass part 300 may have a resonance frequency less than that of the actuator 200. Also, as the spring structure 100 is provided, a vibration characteristic of each of the spring structure 100 and the vibrating mass part 300, which vertically vibrate, may improve. Also, as the low frequency vibrating actuator device 10 has a vibration displacement of about 10 μm or more and a vibration output of about several tens mN, a vibration having a high displacement and a high output may be generated.

Figure 9:
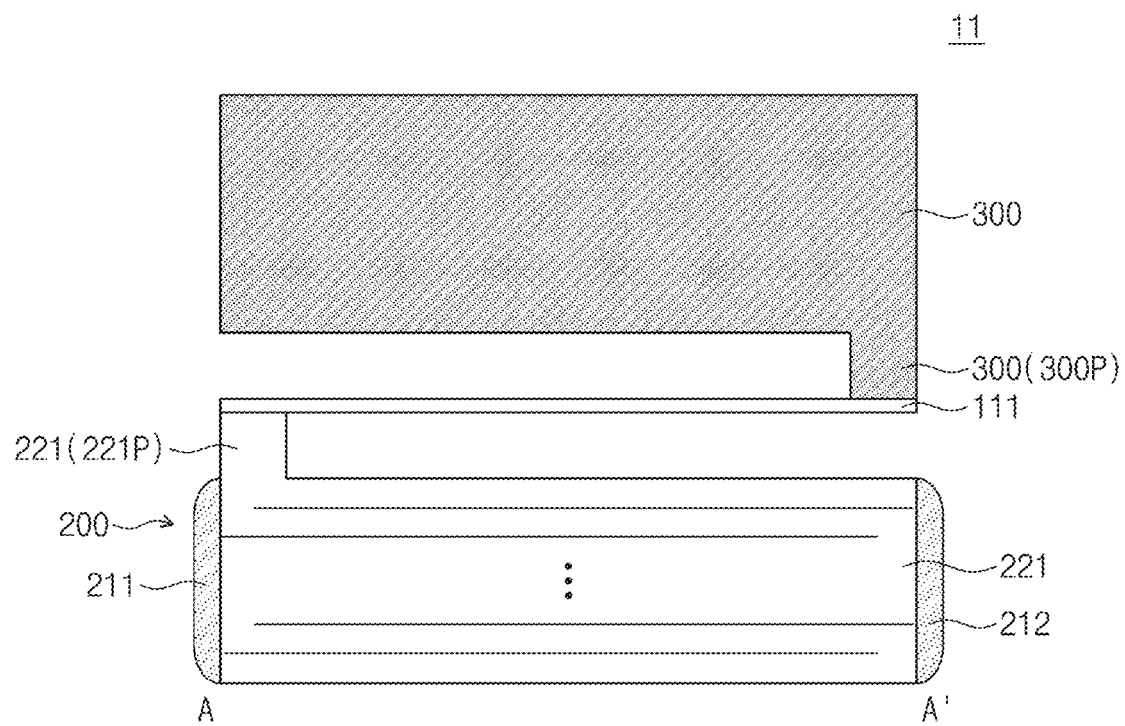
FIG. 9 is a cross-sectional view for explaining the low frequency vibrating actuator device according to the embodiments of the inventive concept and taken along line A-A' of FIG. 6.

FIG. 9 is a cross-sectional view for explaining a low frequency vibrating actuator device according to the embodiments of the inventive concept and taken along line A-A' of FIG. 6. In this embodiment, a detailed description on a technical feature overlapping that described above will be omitted, and a different point will be described in detail.

Referring to FIG. 9, a low frequency vibrating actuator device 11 may include a first thin-film 111 between an actuator 200 and a vibrating mass part 300.

An uppermost insulation layer 221 of the actuator 200 may include a first protruding portion 221P. The first protruding portion 221P may protrude in a direction to the first thin-film 111 from a top surface of the uppermost insulation layer 221 of the actuator 200. The first protruding portion 221P may be disposed adjacent to one side surface of the first thin-film 111.

The vibrating mass part 300 may include a second protruding portion 300P. The second protruding portion 300P may protrude in a direction from a bottom surface of the vibrating mass part 300 to the first thin-film 111. The second protruding portion 221P may be disposed adjacent to the other side surface of the first thin-film 111. The first protruding portion 221P and the second protruding portion 300P may be horizontally offset. That is, in this embodiment, the first protruding portion 221P and the second protruding portion 300P may serve as the spacer instead of the omitted spacers. In other words, the first thin-film 111, the first protruding portion 221P, and the second protruding portion 300P may constitute the spring structure of the embodiments of the inventive concept.

Figure 10A:
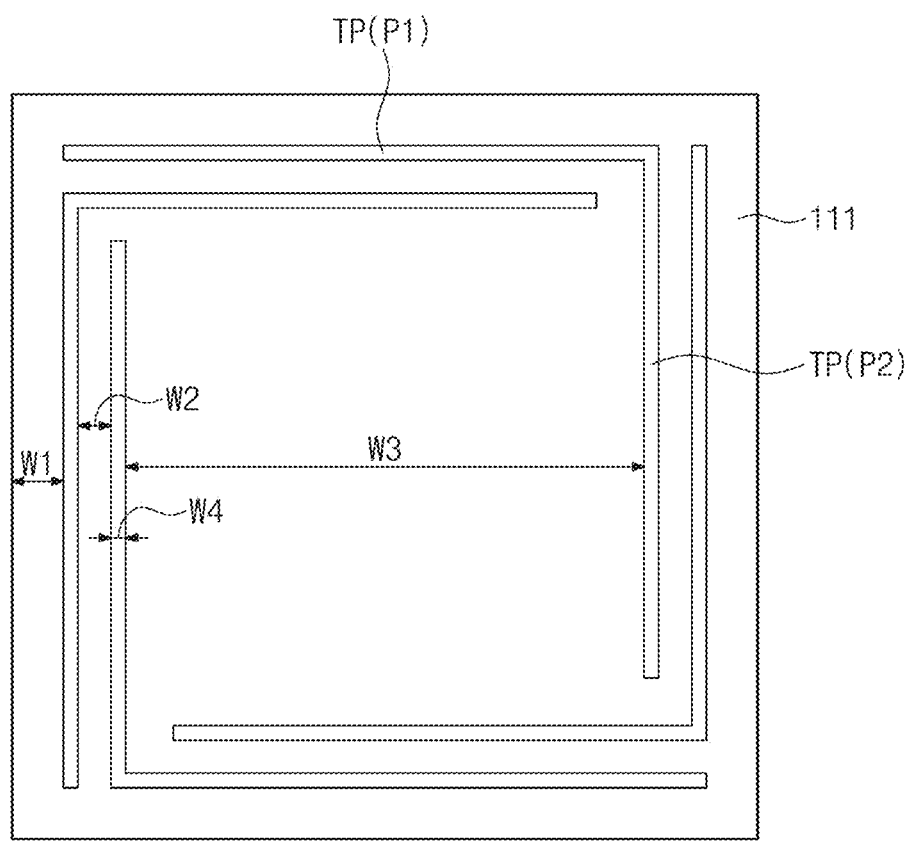
FIGS. 10A and 10B are plan views each illustrating a first thin-film of the lower frequency vibrating actuator device according to the embodiments of the inventive concept.
Figure 10B:
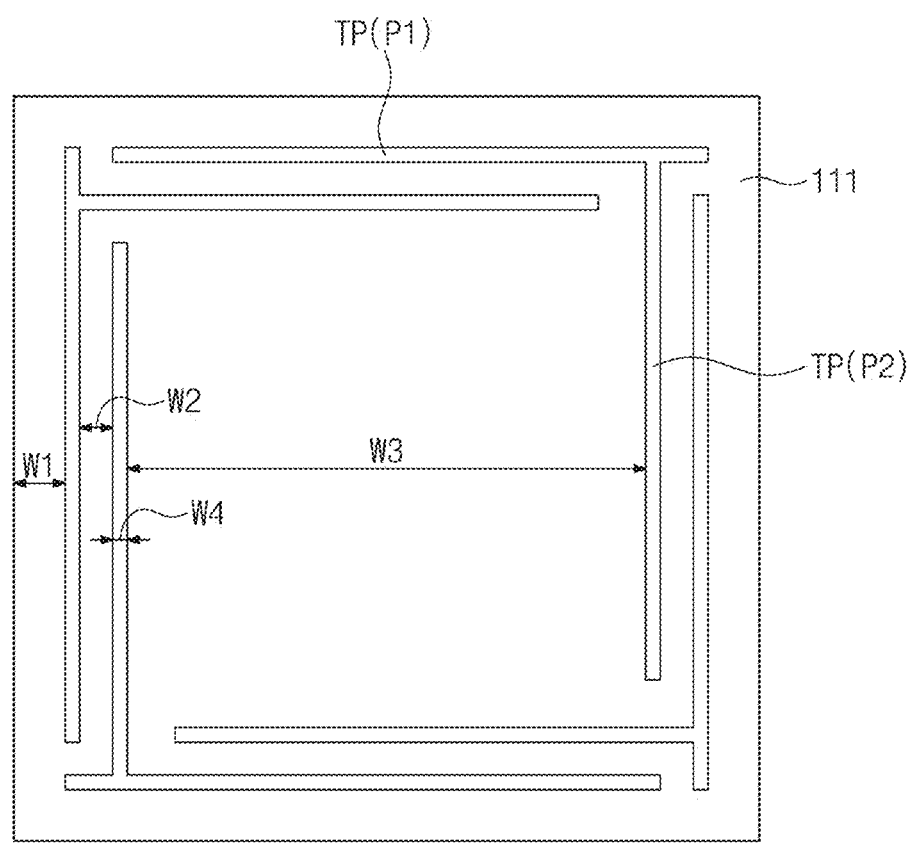
Figure 11:
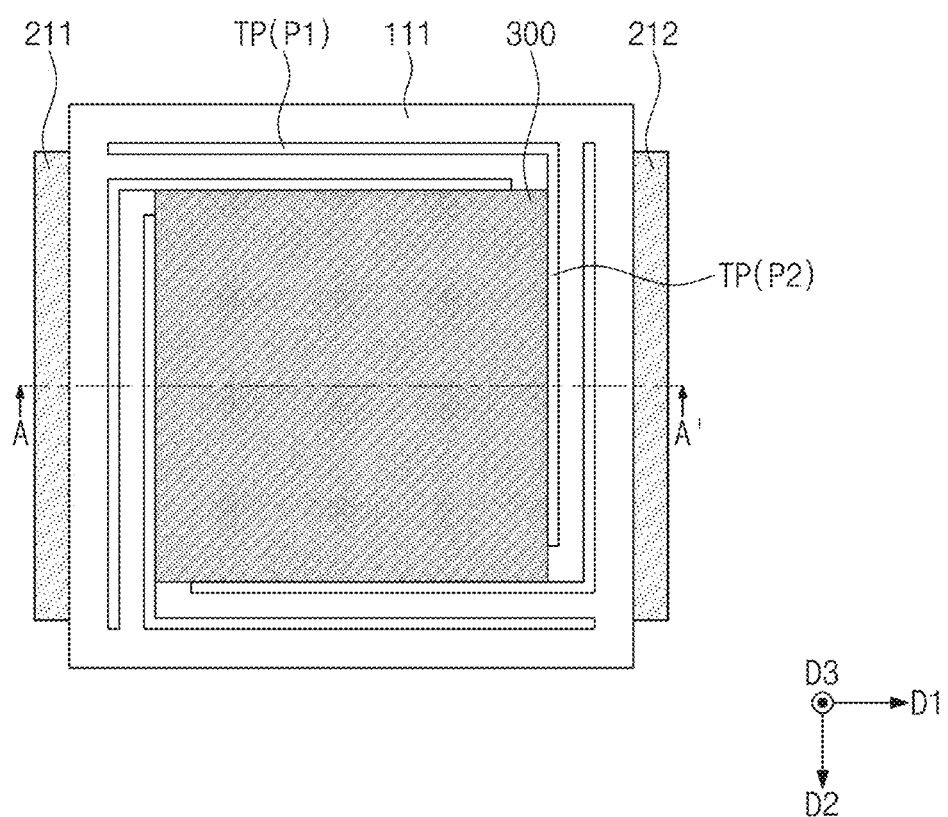
FIG. 11 is a plan view illustrating a low frequency vibrating actuator device according to the embodiments of the inventive concept.
Figure 12A:
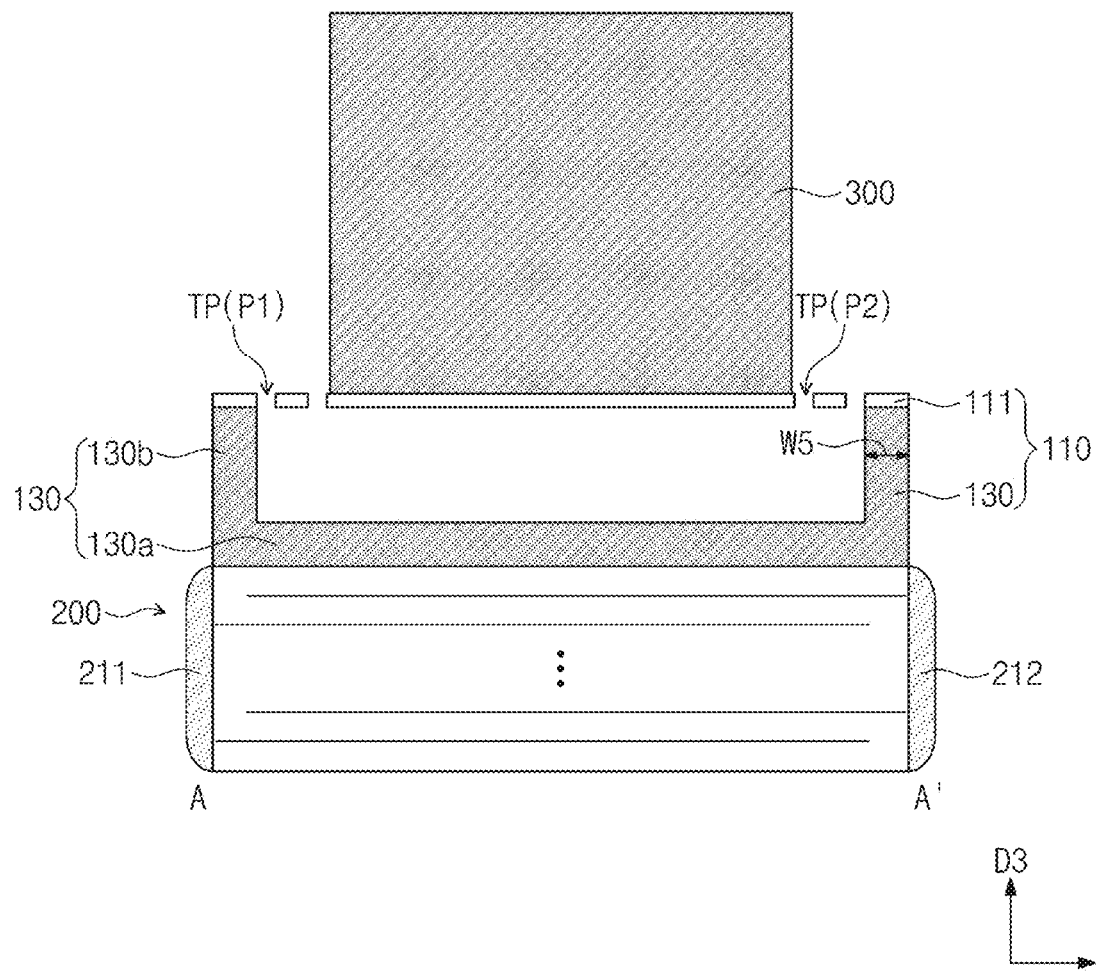
FIG. 12A is a cross-sectional view for explaining the low frequency vibrating actuator device according to the embodiments of the inventive concept and taken along line A-A' of FIG. 11.
Figure 12B:
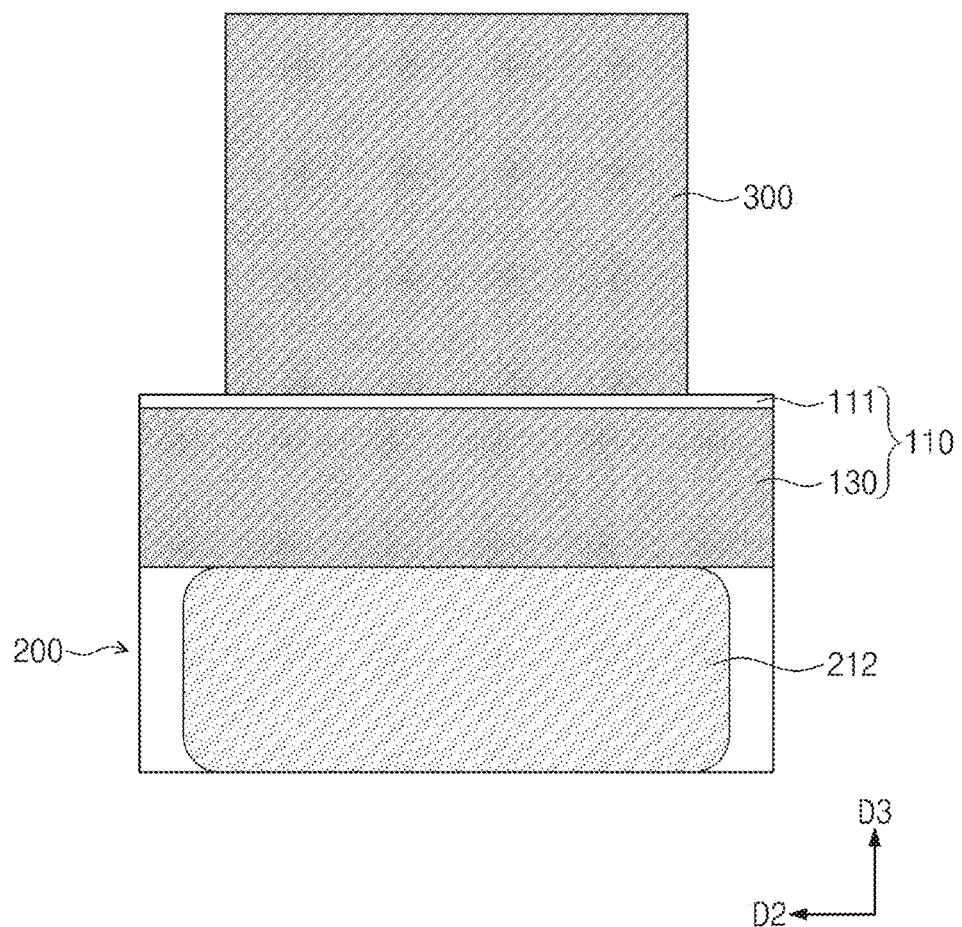
FIG. 12B is a side view illustrating a side surface of the low frequency vibrating actuator of FIG. 11.

FIGS. 10A and 10B are plan views each illustrating the thin-film of the lower frequency vibrating actuator device according to the embodiments of the inventive concept. FIG. 11 is a plan view illustrating a low frequency vibrating actuator device according to the embodiments of the inventive concept. FIG. 12A is a cross-sectional view for explaining the low frequency vibrating actuator device according to the embodiments of the inventive concept and taken along line A-A' of FIG. 11. FIG. 12B is a side view illustrating a side surface of the low frequency vibrating actuator of FIG. 11. In this embodiment, a detailed description on a technical feature overlapping that described above will be omitted, and a different point will be described in detail.

Referring to FIGS. 10A and 10B, the first thin-film 111 may include a through pattern TP. The through pattern TP may be a hole that passes through the first thin-film 111. The through pattern TP may include a first pattern P1 and a second pattern P2. The first pattern P1 may be closer to one side surface of the first thin-film 111 than the second pattern P2.

A width between the first pattern P1 and one side surface of the first thin-film 111 may be a first width W1. A width between the first pattern P1 and the second pattern P2 adjacent to the first pattern P1 may be a second width W2. A width between the second patterns P2 facing each other may be a third width W3. A width of the through pattern TP may be a fourth width W4. For example, the first width W1 may be about 0.4 mm, the second width W2 may be about 0.2 mm, the third width W3 may be about 2.8 mm, and the fourth width W4 may be about 0.1 mm. However, the each of the first to fourth widths W1, W2, W3, and W4 may be freely changed instead of being limited thereto.

Referring to FIG. 10A, the first pattern P1 and the second pattern P2 may be perpendicular to each other. The first pattern P1 may extend in one direction, and the second pattern P2 may extend from an end of the first pattern P1 in a direction perpendicular to the one direction. That is, the through pattern TP may have an L-shape.

Referring to FIG. 10B, the first pattern P1 and the second pattern P2 may be perpendicular to each other. The first pattern P1 may extend in one direction, and the second pattern P2 may extend from a portion adjacent to an end of the first pattern P1 in a direction perpendicular to the one direction. That is, the through pattern TP may have a T-shape. The through pattern TP may have a width, a shape, and a length that are changeable instead of being limited to the illustrations in the drawings.

Referring to FIGS. 11, 12A, and 12B, a low frequency vibrating actuator device 12 may include an actuator 200, a support 130, a first thin-film 111 including a through pattern TP, and a vibrating mass part 300. The first thin-film 111 and the support 130 may constitute a vibration transmitting part 110. The vibration transmitting part 110 may correspond to a modified example of the spring structure according to the embodiments of the inventive concept.

The support 130 may be disposed on the actuator 200. The support 130 may have a U-shaped cross-section. The support 130 may include a first portion 130a covering a top surface of the actuator 200 and second portions 130b each extending in a direction from the first portion 130a to the first thin-film 111. The second portions 130b may be parallel to each other. The second portions 130b may be disposed adjacent to both side surfaces of the first thin-film 111, respectively. In other words, the second portions 130b may contact edges of the first thin-film 111, respectively. A width of each of the second portions 130b may be a fifth width W5. For example, the fifth width W5 may be substantially equal to the first width W1. For another example, the fifth width W5 may be different from the first width W1.

For example, the support 130 may include at least one of a metal material or an alloy having a high rigidity, an organic material, a ceramic material or a semiconductor material having a high rigidity and elasticity. However, the embodiment of the inventive concept is not limited to the above-described materials. For example, the support 130 may include the same material as the first to fourth thin-films 111, 112, 113, and 114 and the first to third spacers 121, 122, and 123. For example, the support 130 may include a different material from the first to fourth thin-films 111, 112, 113, and 114 and the first to third spacers 121, 122, and 123. The support 130 may have a shape, a width, a length, and a depth that are changeable instead of being limited thereto.

The vibrating mass part 300 may be disposed between second patterns P2 facing each other. As the through pattern TP is provided in the first thin-film 111, and the support 130 contacts the edge of the first thin-film 111, a vibration characteristic of the first thin-film 111 and the vibrating mass part 300, which vertically vibrate, may improve.

The vibrating actuator device described with reference to FIGS. 6, 7A, 7B, 9, 11, 12A, and 12B may be referred to as a mass membrane spring piezo-actuator (MMSP).

Figure 13:
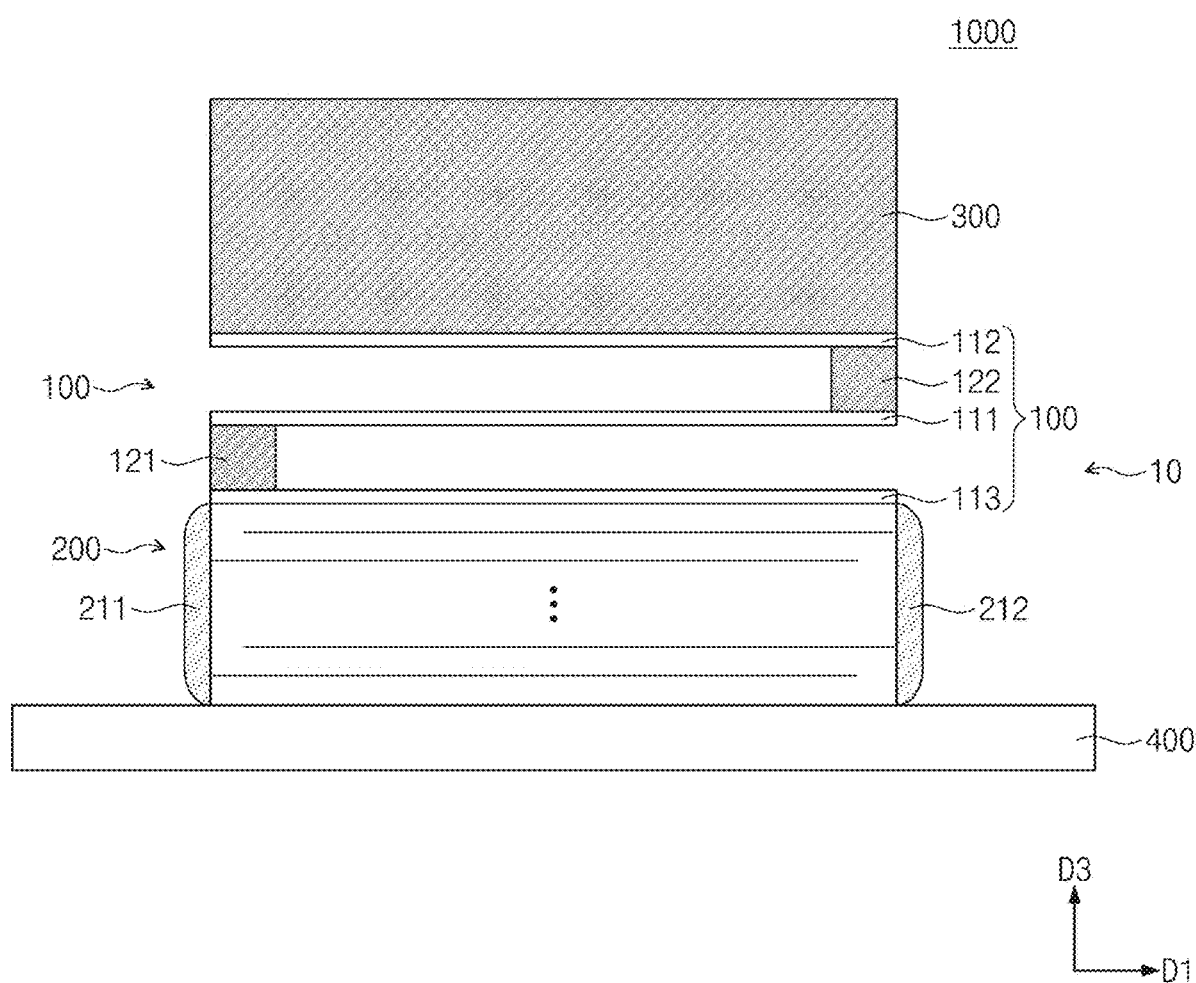
FIGS. 13 to 19 are front views each illustrating a low frequency vibrating actuator apparatus according to the embodiments of the inventive concept.

FIG. 13 is a front view illustrating a low frequency vibrating actuator apparatus according to the embodiments of the inventive concept. In this embodiment, a detailed description on a technical feature overlapping that described above will be omitted, and a different point will be described in detail.

Referring to FIG. 13, a low frequency vibrating actuator apparatus 1000 may include a substrate 400 and a low frequency vibrating actuator device 10 on the substrate 400. Unlike as illustrated, the low frequency vibrating actuator device 11 and 12 described with reference to FIGS. 9, 11, 12A, and 12B may be disposed on the substrate 400. The low frequency vibrating actuator device 10 may be attached onto the substrate 400.

The substrate 400 may include a rigid material or a flexible material. For example, the substrate 400 may include at least one of polydimethylsiloxane (PDMS), elastomer, silicone, Ecoflex, rubber, or urethane. However, the embodiment of the inventive concept is not limited to the above-described materials.

A line pattern (not shown) may be disposed on the substrate 400. The line pattern (not shown) may be electrically connected with the first side electrode 211 and the second side electrode 212 of the actuator 200 to transmit an electrical signal. For another example, the line pattern (not shown) may be disposed in the substrate 400. When the substrate 400 includes a flexible material, the line pattern (not shown) may include a flexible material or have a serpentine structure.

Figure 14:
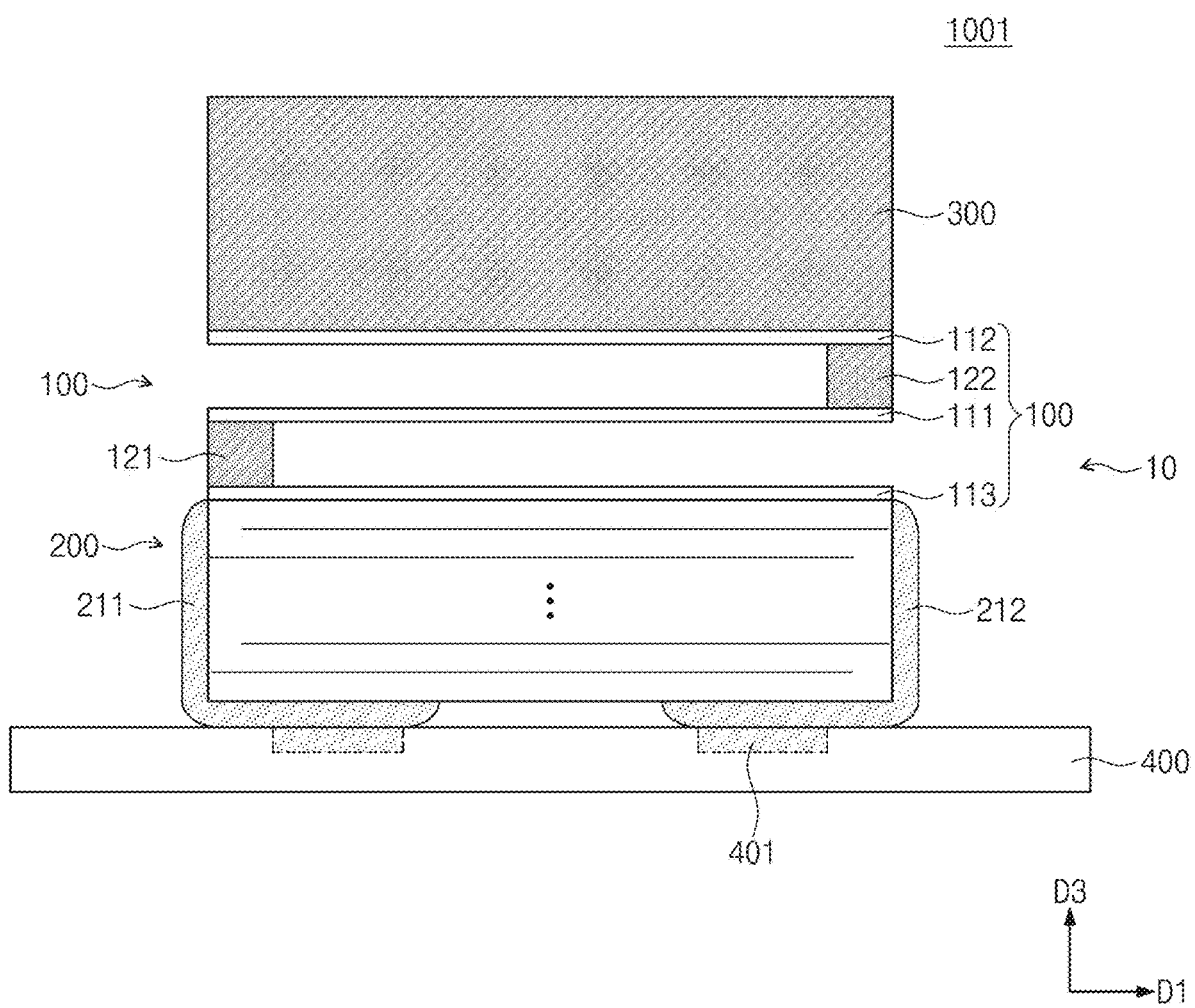

FIG. 14 is a front view illustrating a low frequency vibrating actuator apparatus according to the embodiments of the inventive concept. In this embodiment, a detailed description on a technical feature overlapping that described above will be omitted, and a different point will be described in detail.

Referring to FIG. 14, a low frequency vibrating actuator apparatus 1001 may include connection electrodes 401 disposed in a substrate 400. Top surfaces of the connection electrodes 401 may be exposed from the substrate 400.

The first side electrode 211 and the second side electrode 212 may further extend onto a bottom surface of a lowermost insulation layer. Thus, the connection electrodes 401 may be electrically connected to one of the first side electrode 211 and the second side electrode 212.

The first side electrode 211 and the second side electrode 212 may be electrically connected with the connection electrodes 401 by a conductive adhesive. For example, the conductive adhesive may include a material such as silver, epoxy, copper epoxy, or silver paste. Also, the conductive adhesive may have an adhesive force that is strengthened through a thermal curing process and an optical curing process. For example, the connection electrodes 401 may be electrically connected with the line pattern (not shown).

Figure 15:
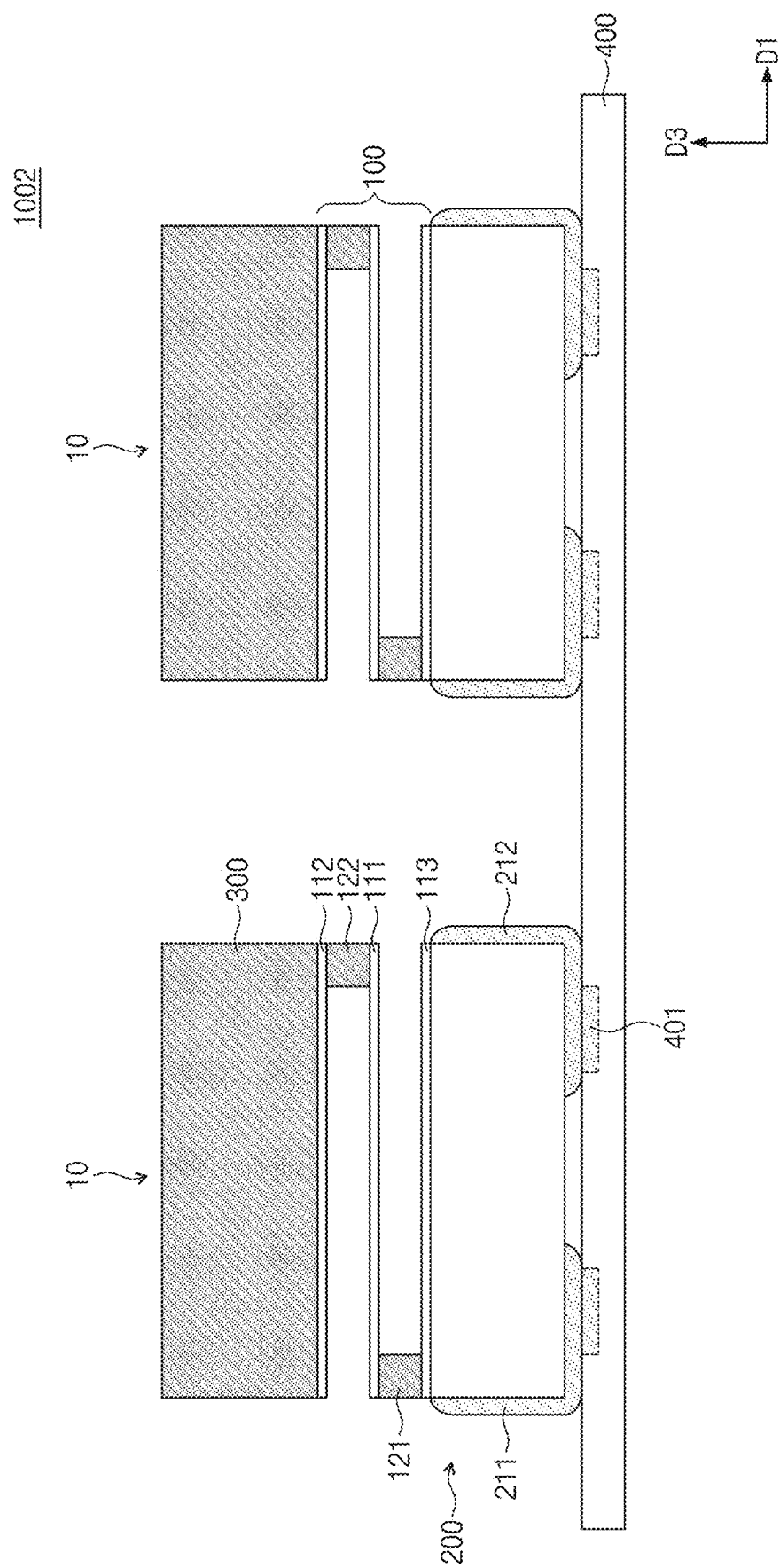

FIG. 15 is a front view illustrating a low frequency vibrating actuator device according to the embodiments of the inventive concept. In this embodiment, a detailed description on a technical feature overlapping that described above will be omitted, and a different point will be described in detail.

Referring to FIG. 15, a low frequency vibrating actuator apparatus 1002 may include a plurality of low frequency vibrating actuator devices 10. Unlike as illustrated, the low frequency vibrating actuator device 11 and 12 described with reference to FIGS. 9, 11, 12A, and 12B may be provided on a substrate 400.

A plurality of low frequency vibrating actuator devices 10 may be arranged in an array shape on the substrate 400. As the plurality of low frequency vibrating actuator devices 10 are arranged, each of the devices may realize a different vibration pattern. As a result, various types of vibration patterns may be realized according to the embodiment.

Figure 16:
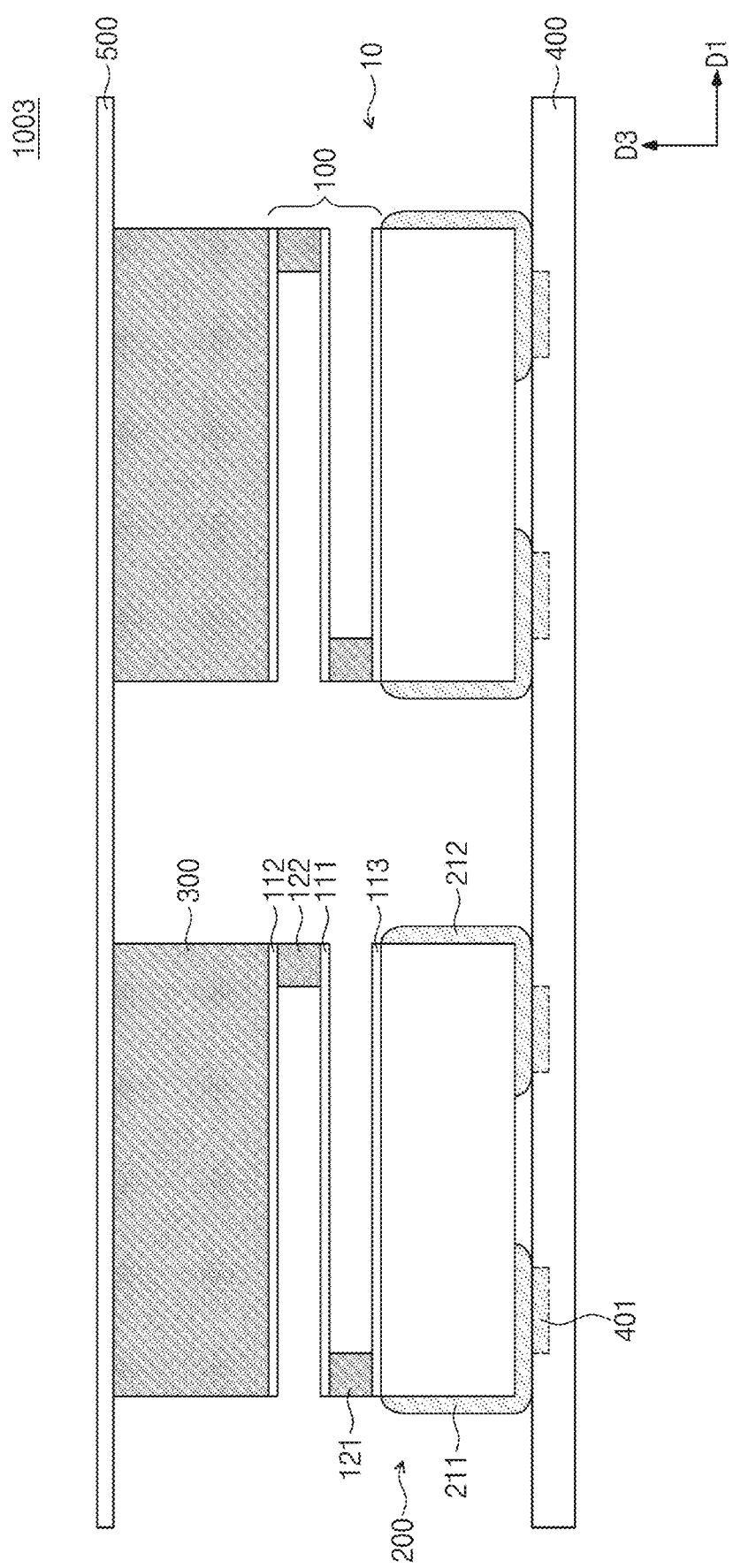

FIG. 16 is a front view illustrating a low frequency vibrating actuator apparatus according to the embodiments of the inventive concept. In this embodiment, a detailed description on a technical feature overlapping that described above will be omitted, and a different point will be described in detail.

Referring to FIG. 16, a low frequency vibrating actuator apparatus 1003 may include a protection layer 500 disposed on a plurality of low frequency vibrating actuator devices 10. The protection layer 500 may cover a plurality of vibrating mass parts 300.

The protection layer 500 may include a flexible material. For example, the protection layer 500 may include at least one of polydimethylsiloxane (PDMS), polymethyl methacrylate (PMMA), Ecoflex, elastomer, silicone, urethane, or rubber. However, the embodiment of the inventive concept is not limited to the above-described materials.

As the protection layer 500 is provided, the low frequency vibrating actuator devices 10 may be protected against external contact and moisture, or a human skin contacting the low frequency vibrating actuator apparatus 1003 may be protected.

Figure 17:
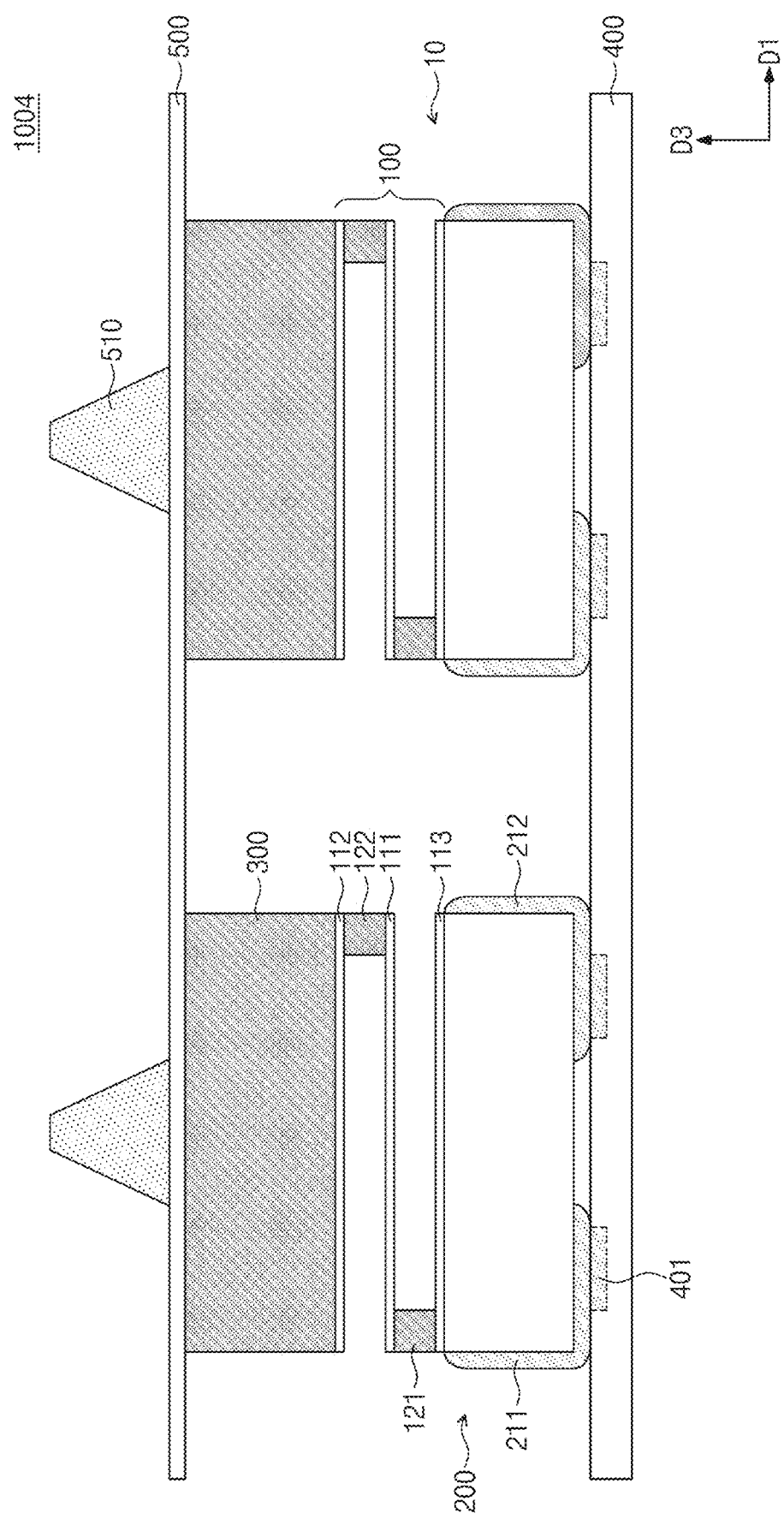

FIG. 17 is a front view illustrating a low frequency vibrating actuator apparatus according to the embodiments of the inventive concept. In this embodiment, a detailed description on a technical feature overlapping that described above will be omitted, and a different point will be described in detail.

Referring to FIG. 17, a low frequency vibrating actuator apparatus 1004 may include at least one projection 510 disposed on a protection layer 500. The projection 510 may vertically overlap a vibrating mass part 300. One projection 510 may be disposed on one low frequency vibrating actuator device 10 in a corresponding manner.

In the projection 510, a width of a top surface may be less than that of a bottom surface. For example, the projection 510 may have a width that gradually decreases in the third direction D3. The projection 510 may have a shape and a width that are changeable instead of being limited thereto.

The projection 510 may include a rigid material or a flexible material. For example, the projection 510 may include at least one of a hard material such as metal, plastic, and ceramic or a flexible material such as PDMS, elastomer, silicone, Ecoflex, rubber, or urethane. However, the embodiment of the inventive concept is not limited to the above-described materials.

As the projection 510 is provided, a vibration generated from the low frequency vibrating actuator device 10 may be further effectively transmitted to a skin surface.

Figure 18:
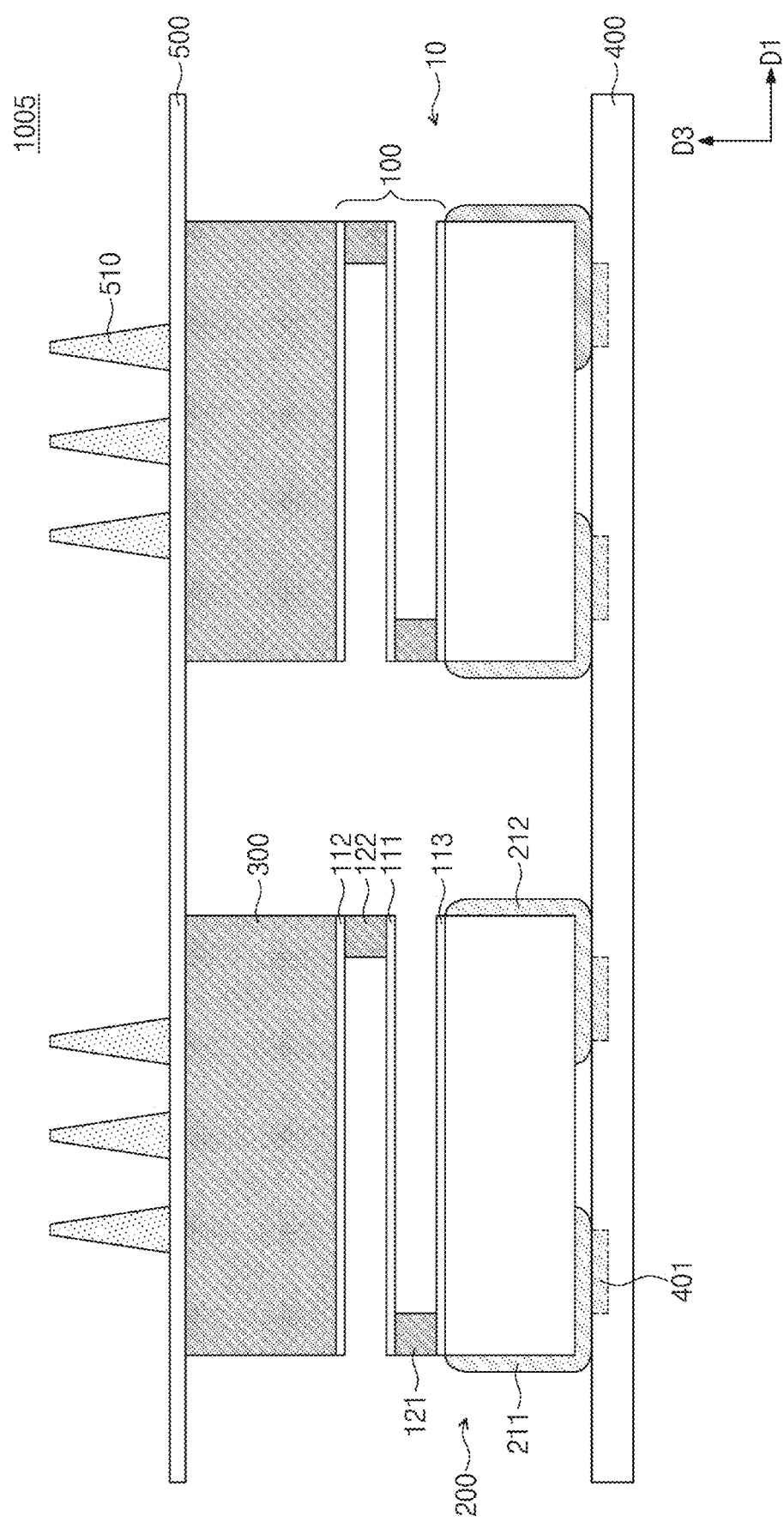

FIG. 18 is a front view illustrating a low frequency vibrating actuator apparatus according to the embodiments of the inventive concept. In this embodiment, a detailed description on a technical feature overlapping that described above will be omitted, and a different point will be described in detail.

Referring to FIG. 18, a low frequency vibrating actuator apparatus 1005 may include a plurality of projections 510. As the projections 510 each having a relatively small width are provided on the protection layer 500, the plurality of projections 510 may correspond to one low frequency vibrating actuator device 10. The plurality of projections 510 may vertically overlap one vibrating mass part 300.

As the plurality of projections 510 are provided, a high density vibration stimulus may be possibly generated.

Figure 19:
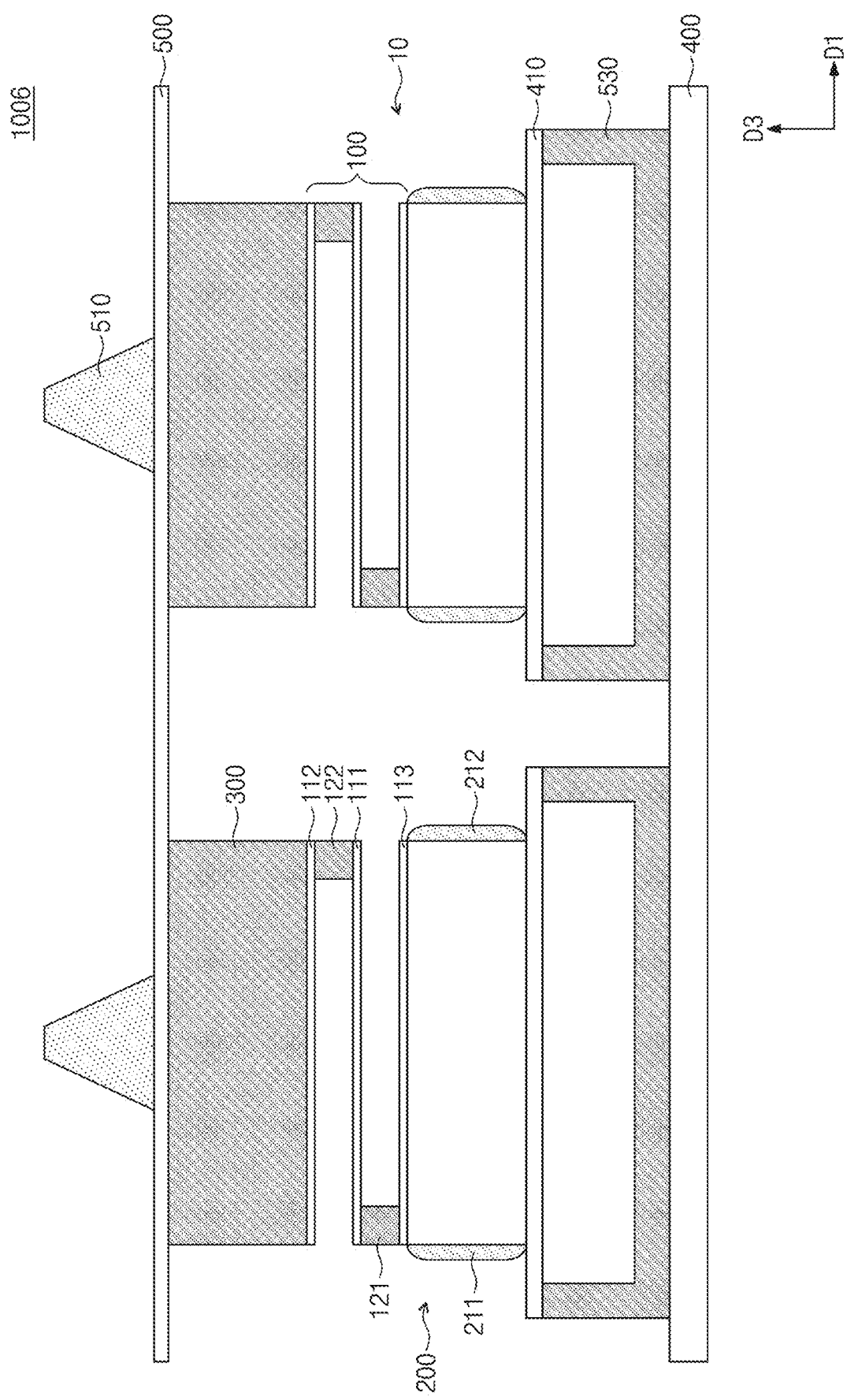

FIG. 19 is a front view illustrating a low frequency vibrating actuator apparatus according to the embodiments of the inventive concept. In this embodiment, a detailed description on a technical feature overlapping that described above will be omitted, and a different point will be described in detail.

Referring to FIG. 19, a low frequency vibrating actuator apparatus 1006 may include a vibrating layer 410 disposed below each low frequency vibrating actuator device 10 and a support 530 disposed between the vibrating layer 410 and a substrate 400.

The vibrating layer 410 may include a flexible material. The vibrating layer 410 may include the same material as the protection layer 500. For example, the protection layer 500 may include at least one of PDMS, PMMA, Ecoflex, elastomer, silicone, urethane, or rubber. However, the embodiment of the inventive concept is not limited to the above-described materials. Each of the low frequency vibrating actuator devices 10 may be disposed on the vibrating layer 410.

The support 530 may be substantially the same as the support 130 described with reference to FIGS. 12A and 12B. The support 530 may be disposed on the substrate 400 and contact an edge of the vibrating layer 410.

As the vibrating layer 410 and the support 530 are provided, a vibration interference between the low frequency vibrating actuator devices 10 may be reduced. In other words, a vibration of the low frequency vibrating actuator devices 10 may be minimally transmitted to the substrate 400 or minimally propagated to the adjacent low frequency vibrating actuator device 10.

Figure 20A:
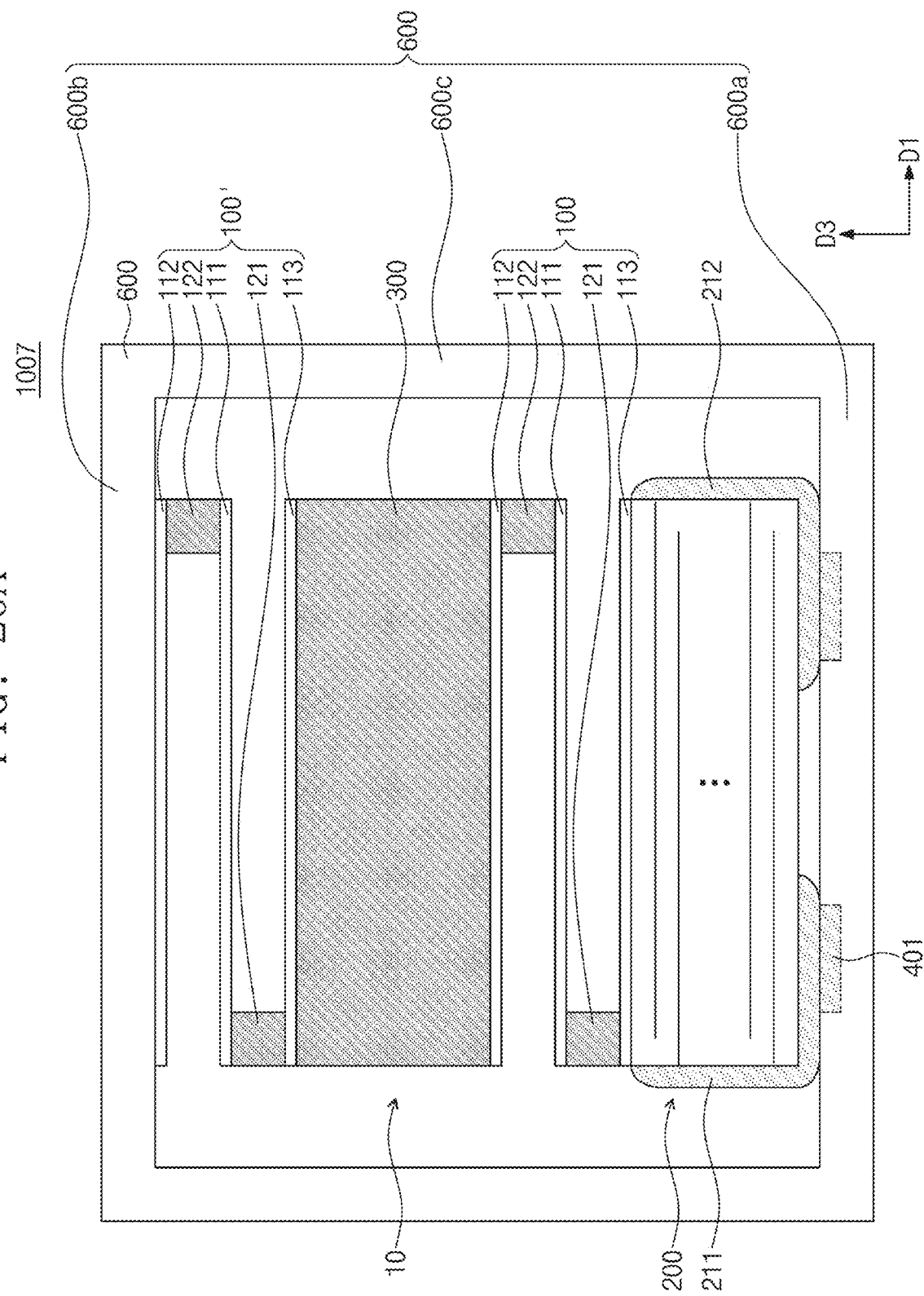

FIGS. 20A and 20B are a plan view and a side view illustrating a low frequency vibrating actuator apparatus according to the embodiments of the inventive concept. In this embodiment, a detailed description on a technical feature overlapping that described above will be omitted, and a different point will be described in detail.

Referring to FIGS. 20A and 20B, a low frequency vibrating actuator apparatus 1007 may include a box-type structure 600. The box-type structure 600 may include at least one of a metal material, a ceramic material, or an organic material.

A low frequency vibrating actuator device 10 may include a first spring structure 100 disposed between an actuator 200 and a vibrating mass part 300. The low frequency vibrating actuator device 10 may include a second spring structure 100' disposed on the vibrating mass part 300. The second spring structure 100' may be one of the spring structures 100a, 100b, 100c, 100d, and 100e described with reference to FIGS. 1 to 5. For another example, the second spring structure 100' may be omitted.

The box-type structure 600 may include a lower portion 600a, an upper portion 600b, and connection portions 600c. Connection electrodes 401 may be disposed in the lower portion 600a. The actuator 200 may be disposed on the lower portion 600a. The lower portion 600a and the upper portion 600b may be spaced apart from each other in the third direction D3. The lower portion 600a and the upper portion 600b may be parallel to each other. The connection portions 600c may connect the lower portion 600a and the upper portion 600b to each other. The connection portions 600c each may extend in the third direction D3.

The second spring structure 100' may contact the upper portion 600b. Thus, the low frequency vibrating actuator device 10 may be mounted into the box-type structure 600. For another example, when the second spring structure 100' is omitted, the vibrating mass part 300 may contact the upper portion 600b.

As the box-type structure 600 is provided, the low frequency vibrating actuator device 10 may be mounted into the box-type structure 600 and protected from an external impact.

Experimental examples 1 to 4 below are performed on the low frequency vibrating actuator device according to the embodiments of the inventive concept.

EXPERIMENTAL EXAMPLE 1

Figure 21:
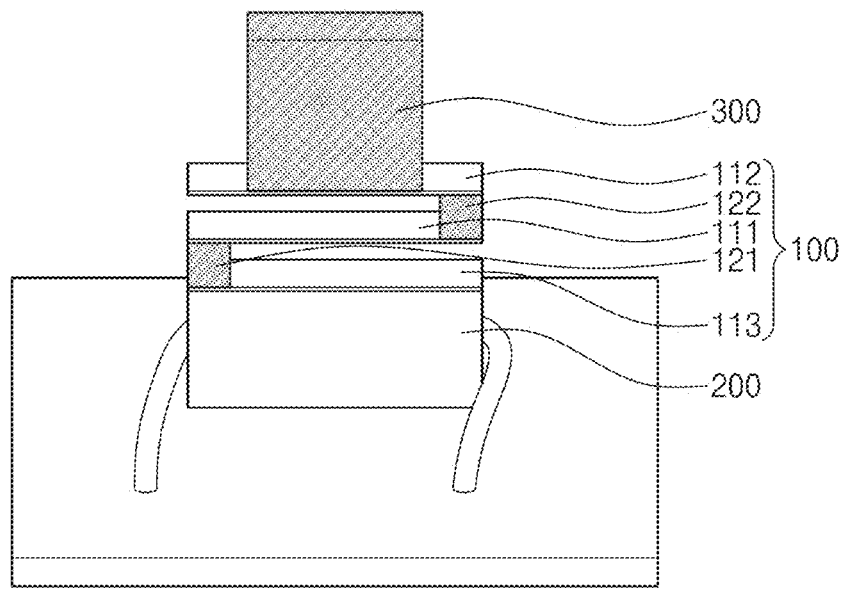
FIG. 21 is an image of the low frequency vibrating actuator device according to the embodiments of the inventive concept.

FIG. 21 is an image of the low frequency vibrating actuator device according to the embodiments of the inventive concept. In this experimental example, a low frequency vibrating actuator device having a structure of FIG. 21 is used. The low frequency vibrating actuator device of FIG. 21 may have the substantially same structure as in FIG. 7A. In this experimental example, an actuator 200 has a size of about 5 mm×5 mm×2 mm (width×length×height). Each of insulation layers in the actuator 200 is made of PZT and has a thickness of about 50 μm. The insulation layers are laminated by about 40 layers. A spring structure 100 is provided on the actuator 200. The spring structure 100 include first to third thin-films 111, 112, and 113 each of which has a thickness of about 50 μm and is made of stainless steel, and first and second spacers 121 and 122 each of which is made of tungsten carbide (WC) and has a size of about 0.7 mm×0.7 mm×5 mm. A vibrating mass part 300 that is made of tungsten carbide (WC) and has a size of about 3 mm×3 mm×2.5 mm is provided on the spring structure 100.

Each of FIGS. 22A and 22B shows a result obtained by analyzing a traction force of the spring structure and a vibration displacement of the vibrating mass part around a resonance frequency when a voltage is applied to the low frequency vibrating actuator device by using a finite element analysis method in the experimental example 1. Here, an alternating current voltage of about 0 to about 30 V is applied to the actuator 200.

FIG. 22A shows a result obtained by analyzing a traction force of the spring structure and a vibration displacement of the vibrating mass part 300 around a lowest resonance frequency of about 193.48 Hz. FIG. 22B shows a result obtained by analyzing a traction force of the spring structure and a vibration displacement of the vibrating mass part around a third lowest resonance frequency of about 394.49 Hz.

Although each of the vibration displacement and the traction force at the resonance frequency is extremely high in a theoretical analysis, the vibration displacement and the traction force around the resonance frequency in a real experiment may be similar to real values in consideration of damping. Thus, it is expected that, at the first resonance frequency of about 192 Hz to about 194 Hz, the vibration displacement (in a vertical direction) is about 4 μm to about 6 μm, and the traction force (in the vertical direction) is about 0.35 N to about 0.36 N. Also, it is expected that, at the third resonance frequency of about 393 Hz to about 395 Hz, the vibration displacement (in a vertical direction) is about 130 μm to about 132 μm, and the traction force (in the vertical direction) is about 7N to about 8N.

EXPERIMENTAL EXAMPLE 2

In this experimental example, a low frequency vibrating actuator device having the structure of FIG. 21 is used. In this experimental example, an actuator 200 has a size of about 5 mm×5 mm×2 mm (width×length×height). Each of insulation layers in the actuator 200 is made of PZT and has a thickness of about 50 μm. The insulation layers are laminated by about 40 layers. A spring structure 100 is provided on the actuator 200. The spring structure 100 include first to third thin-films 111, 112, and 113 each of which has a thickness of about 50 μm and is made of stainless steel, and first and second spacers 121 and 122 each of which is made of tungsten carbide (WC). A vibrating mass part 300 that is made of tungsten carbide (WC) and has a size of about 3 mm×3 mm×2.5 mm is provided on the spring structure 100.

Figure 23:
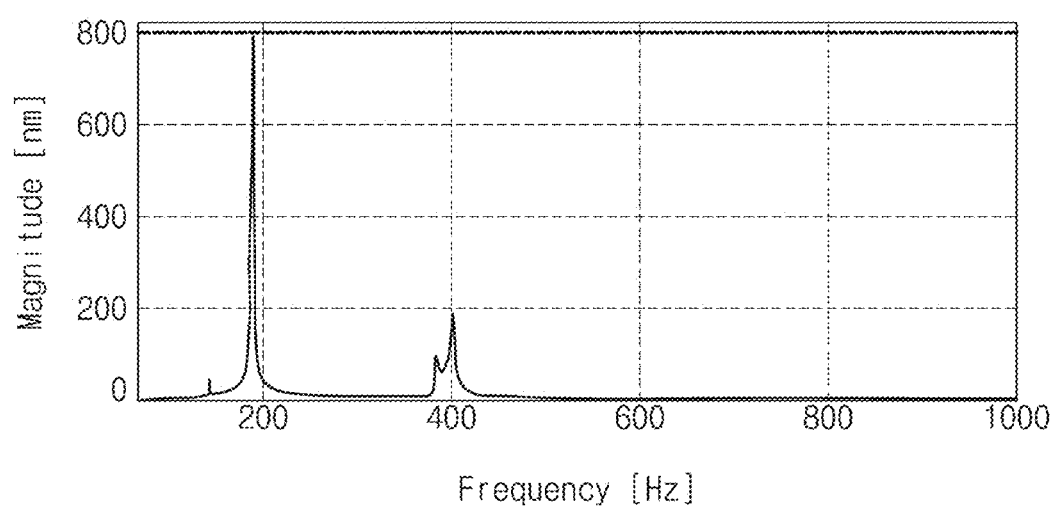
FIG. 23 is a graph showing a result obtained by measuring a vibration displacement according to a frequency when a voltage is applied to the low frequency vibrating actuator device by using a laser vibrometer in the experimental example 1.

FIG. 23 is a graph showing a result obtained by measuring a vibration displacement according to a frequency when a voltage is applied to the low frequency vibrating actuator device by using a laser vibrometer in the experimental example 2.

FIG. 23 shows a vibration spectrum result for each frequency when a vibration displacement of the vibrating mass part 300 is measured by the laser vibrometer while applying an alternating current voltage of about 70 Hz to about 1000 Hz of about 0 V to about 30V to both ends of the low frequency vibrating actuator. This result is obtained by measuring a relative displacement at a different point based on one point of the vibrating mass part 300. An absolute vibration displacement may be greater by about three times than this result value, and a result of a frequency scan mode may be less by about 20 times to about 40 times than that when a sine wave voltage having a specific frequency is applied. It may be checked that a lowest resonance frequency is about 190 Hz, and a third lowest resonance frequency is about 400 Hz.

Figure 24A:
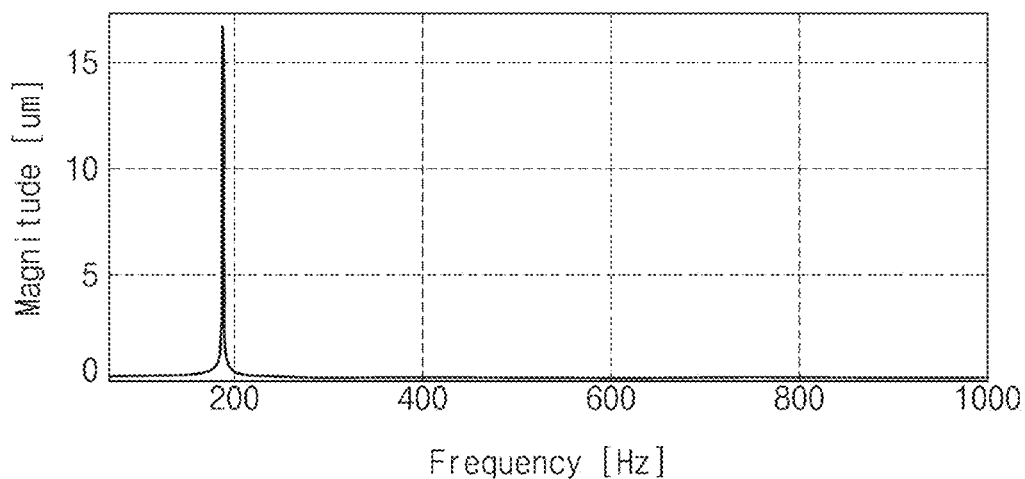
FIGS. 24A and 24B each show a result obtained by measuring a vibration displacement according to a frequency by using a laser vibrometer when a sine wave having a single frequency of a resonance frequency is applied to the low frequency vibrating actuator device in an experimental example 2.
Figure 24B:
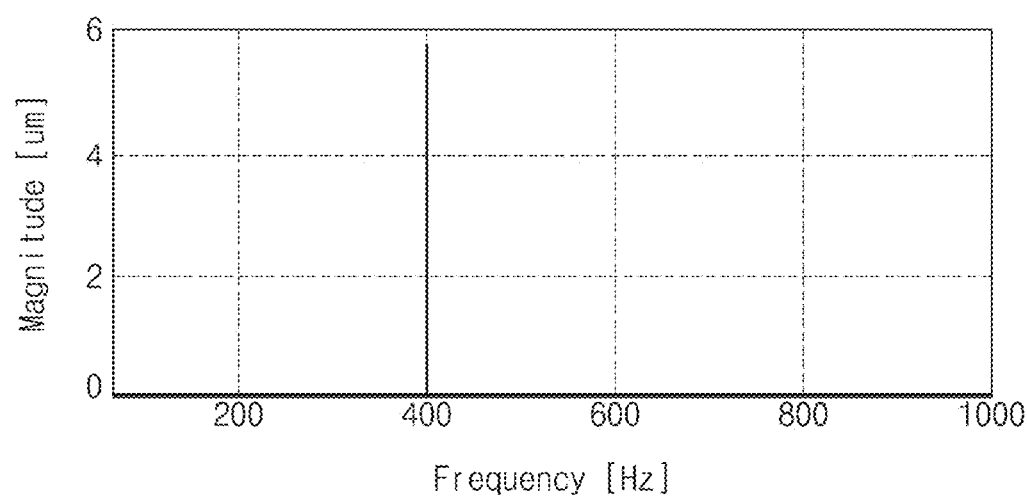

Each of FIGS. 24A and 24B shows a result obtained by measuring a vibration displacement according to a frequency by using the laser vibrometer when a sine wave having a single frequency of a resonance frequency is applied to the low frequency vibrating actuator device in the experimental example 2.

FIG. 24A shows an extremely high vibration displacement to a single sine wave voltage of about 190 Hz, which is equal to or greater than about 16 μm, and FIG. 24B shows an extremely high vibration displacement to a single sine wave voltage of about 400 Hz, which is equal to or greater than about 5 μm. An absolute vibration displacement may be greater by about three times than this result value.

That is, the lower frequency vibrating actuator device according to the embodiments of the inventive has a resonance frequency of about 500 Hz or less that is sensible by a human, and since a range of a resonance spectrum increases as a Q factor of the resonance decreases due to damping when hands contacts the lower frequency vibrating actuator device, the human may easily feel the vibration although a sine wave of about 100 Hz to about 500 Hz is applied.

EXPERIMENTAL EXAMPLE 3

In this experimental example, a low frequency vibrating actuator device having the structure of FIG. 21 is used. In this experimental example, an actuator 200 has a size of about 3 mm×3 mm×2 mm (width×length×height). Each of insulation layers in the actuator 200 is made of PZT and has a thickness of about 50 μm. The insulation layers are laminated by about 40 layers. A spring structure 100 is provided on the actuator 200. The spring structure 100 include first to third thin-films 111, 112, and 113 each of which has a thickness of about 50 μm and is made of stainless steel, and first and second spacers 121 and 122 each of which is made of tungsten carbide (WC) and has a size of about 0.5 mm×0.5 mm×3 mm. A vibrating mass part 300 that is made of tungsten carbide (WC) and has a size of about 3 mm×3 mm×2.5 mm is provided on the spring structure 100.

FIG. 25 shows a result obtained by analyzing a traction force of the spring structure and a vibration displacement of the vibrating mass part around a resonance frequency when a voltage is applied to the low frequency vibrating actuator device by using a finite element analysis method in the experimental example 3. Here, an alternating current voltage of about 0 to about 30 V is applied to the actuator 200.

FIG. 25 shows a result obtained by analyzing a traction force of the spring structure 100 and a vibration displacement of the vibrating mass part 300 around a lowest resonance frequency of about 232.31 Hz. Although each of the vibration displacement and the traction force at the resonance frequency is extremely high in a theoretical analysis, the vibration displacement and the traction force around the resonance frequency in a real experiment may be similar to real values in consideration of damping. Thus, it is expected that, at a first resonance frequency of about 231 to about 233 Hz, the vibration displacement (in the vertical direction) is about 14 μm to about 17 μm, and the traction force (in the vertical direction) is about 1.18N to about 1.25N.

EXPERIMENTAL EXAMPLE 4

In this experimental example, a low frequency vibrating actuator device having a structure of FIGS. 11, 12A, and 12B is used. In this experimental example, an actuator 200 has a size of about 5 mm×5 mm×2 mm (width×length×height). Each of insulation layers in the actuator 200 is made of PZT and has a thickness of about 50 μm. The insulation layers are laminated by about 40 layers. A support 130 is made of tungsten carbide (WC), and a second portion 130b has a width W5 of about 0.4 mm. A first thin-film 111 is made of stainless steel and has a thickness of about 50 μm. The first thin-film has a first width W1 of about 0.4 mm, a second width W2 of about 0.2 mm, a third width W3 of about 2.8 mm, and a fourth width W4 of about 0.1 mm. A vibrating mass part 300 is made of tungsten carbide (WC) and has a size of about 2.8 mm×2.8 mm×2.8 mm.

FIG. 26 shows a result obtained by analyzing a traction force of the spring structure and a vibration displacement of the vibrating mass part around a resonance frequency when a voltage is applied to the low frequency vibrating actuator device by using a finite element analysis method in the experimental example 4. Here, an alternating current voltage of about 0 to about 30 V is applied to the actuator 200.

Although each of the vibration displacement and the traction force at the resonance frequency is extremely high in a theoretical analysis, the vibration displacement and the traction force around the resonance frequency in a real experiment may be similar to real values in consideration of damping. Thus, it is expected that, at a first resonance frequency of about 228 to about 231 Hz, the vibration displacement (in the vertical direction) is about 64 µm to about 65 µm, and the traction force (in the vertical direction) is about 0.4N to about 0.5N.

Figure 27:
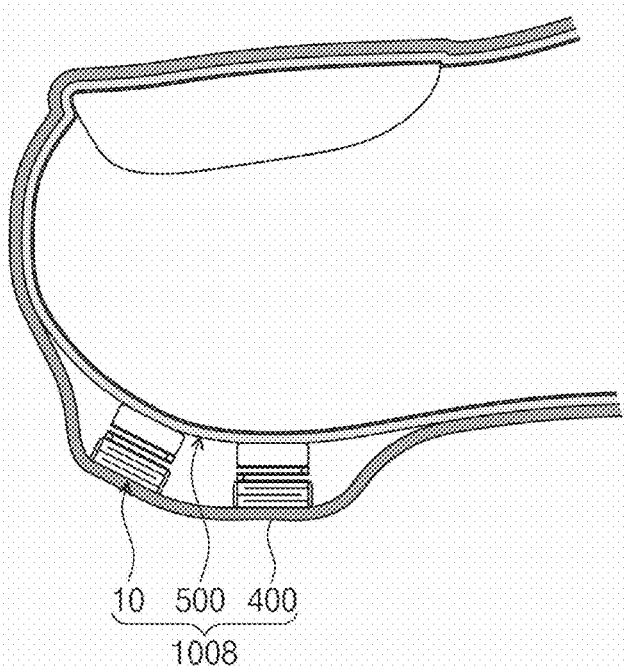
FIGS. 27 to 29 are views each illustrating usage examples of the low frequency vibrating actuator apparatus according to the embodiments of the inventive concept.
Figure 28:
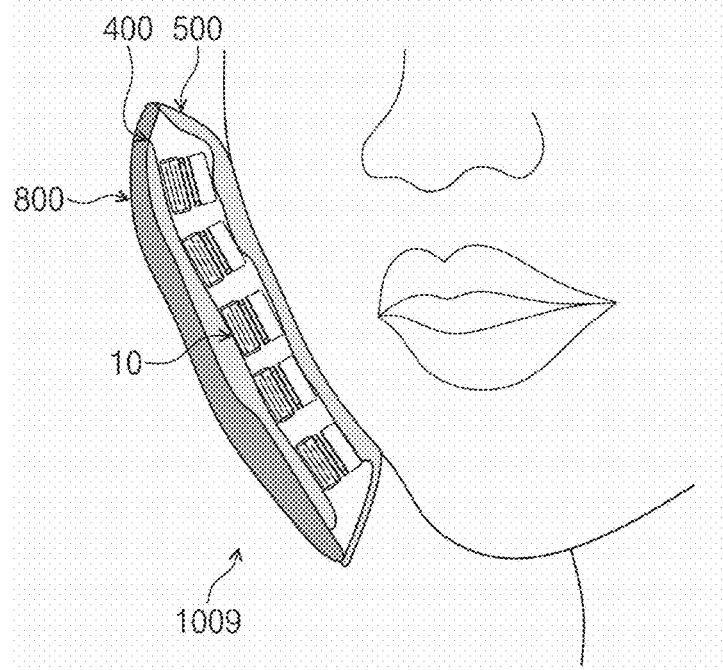
Figure 29:
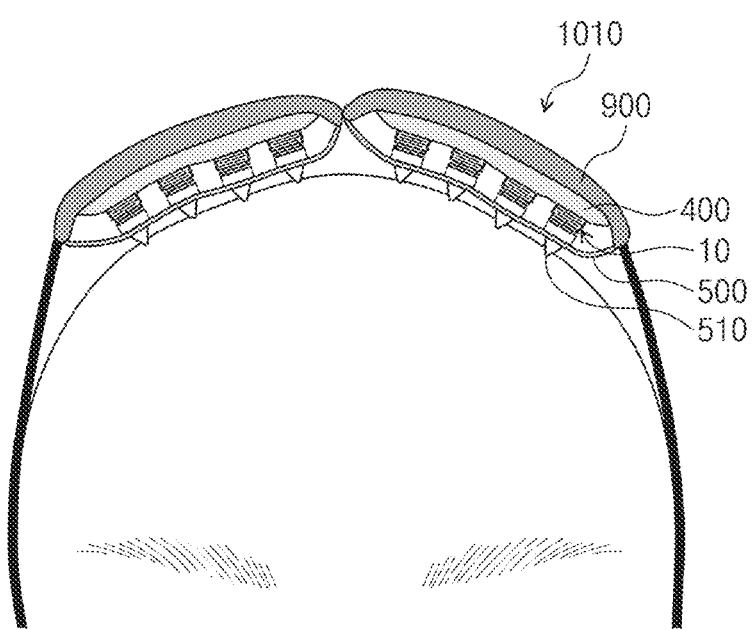

FIGS. 27 to 29 are views each illustrating a usage example of a low frequency vibrating actuator apparatus according to the embodiments of the inventive concept.

Referring to FIG. 27, a low frequency vibrating actuator apparatus 1008 may be embedded in a thimble or a glove to transmit a vibration to a finger. A low frequency vibrating actuator device 10 may be attached onto a substrate 400 having a flexibility and closely contact a skin to transmit a vibration to the skin through a protection layer 500 for protecting the low frequency vibrating actuator device 10. A plurality of low frequency vibrating actuator devices 10 may be arranged in an array shape on the substrate 400.

In order to smoothly transmit the vibration to the skin, the projection 510, the vibrating layer 410, and the support 530, which are described with reference to FIGS. 17 to 19, may be additionally provided. The above-described apparatus may be used in a product that provides tactile sense information such as braille or provides a tactile sense or a texture such as a VR/AR glove. For example, the low frequency vibrating actuator apparatus 1008 may be referred to as a 'thimble-type braille recognition apparatus' or a 'VR/AR glove'.

Referring to FIG. 28, a low frequency vibrating actuator apparatus 1009 may be used as a skin vibration stimulating apparatus. A low frequency vibrating actuator device 10 may be attached onto a substrate 400 having a flexibility and closely contact a skin to transmit a vibration to the skin through a protection layer 500 for protecting the skin and the low frequency vibrating actuator device 10. A plurality of low frequency vibrating actuator devices 10 may be arranged in an array shape on the substrate 400.

The low frequency vibrating actuator apparatus 1009 may further include a mask for fixing the low frequency vibrating actuator devices 10. In order to closely contact the mask 800 to the skin, a band (not shown) or a closely contacting device (not shown) may be additionally provided. The above-described apparatus may improve a blood circulation of a facial skin. Also, a massage effect may be maximized by providing a vibration stimulus having various patterns allowing a nutritional component to be easily absorbed into the skin. In order to smoothly transmit the vibration to the skin, the projection 510, the vibrating layer 410, and the support 530, which are described with reference to FIGS. 17 to 19, may be additionally provided. For example, the low frequency vibrating actuator apparatus 1009 may be referred to as a 'skin massager'.

Referring to FIG. 29, a low frequency vibrating actuator apparatus 1010 may be used as a scalp vibration stimulating apparatus. A low frequency vibrating actuator device 10 may be attached onto a substrate 400 having a flexibility and transmit a vibration to a scalp through a protection layer 500 for protecting the scalp and the low frequency vibrating actuator device 10. Also, at least one projection 510 is provided on the protection layer 500 to further effectively transmit a vibration to the scalp. A plurality of low frequency vibrating actuator devices 10 may be arranged in an array shape on the substrate 400.

The low frequency vibrating actuator apparatus 1010 may further include a helmet 900 that fixes the low frequency vibrating actuator devices 10 and is worn on the scalp of a human. In order to closely contact the helmet 900 to the skin, a band (not shown) or a closely contacting device (not shown) may be additionally provided. The above-described apparatus may improve a blood circulation of the scalp. Also, a massage effect may be maximized by providing a vibration stimulus having various patterns allowing a nutritional component to be easily absorbed into the scalp. The vibrating layer 410 and the support 530, which are described with reference to FIG. 19, may be additionally provided. For example, the low frequency vibrating actuator apparatus 1010 may be referred to as a 'scalp massager'.

According to the embodiment of the inventive concept, as the spring structure and the vibrating mass part are provided on the actuator, the low frequency vibration sensible by the human may be outputted.

The object of the present invention is not limited to the aforesaid, but other objects not described herein will be clearly understood by those skilled in the art from descriptions below.

Although the embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. A low frequency vibrating actuator device comprising:
   an actuator configured to generate a vibration by receiving a voltage;
   a spring structure disposed on the actuator; and
   a vibrating mass part disposed on the spring structure,
   wherein the spring structure comprises:
   a first thin-film;
   a first spacer disposed between the first thin-film and the actuator; and
   a second spacer disposed between the first thin-film and the vibrating mass part,
   wherein the first spacer and the second spacer are horizontally offset from each other.

2. The low frequency vibrating actuator device of claim 1, wherein the first spacer is disposed adjacent to one side surface of the first thin-film, and
   the second spacer is disposed adjacent to the other side surface of the first thin-film.

3. The low frequency vibrating actuator device of claim 1, wherein the spring structure further comprises:
   a second thin-film disposed between the second spacer and the vibrating mass part; and
   a third thin-film disposed between the first spacer and the actuator.

4. The low frequency vibrating actuator device of claim 1, wherein the spring structure further comprises a second thin-film and a third spacer, which are disposed between the second spacer and the vibrating mass part,
   wherein the third spacer is disposed between the second thin-film and the vibrating mass part.

5. The low frequency vibrating actuator device of claim 4, wherein the third spacer vertically overlaps the first spacer and is horizontally offset from the second spacer.

6. The low frequency vibrating actuator device of claim 4, wherein the spring structure further comprises:

a third thin-film disposed between the first spacer and the actuator; and a fourth thin-film disposed between the third spacer and the vibrating mass part.

7. The low frequency vibrating actuator device of claim 1, wherein the actuator comprises:
a plurality of insulation layers that are laminated with each other;
internal electrodes that are alternately laminated between the insulation layers adjacent to each other; and
a first side electrode and a second side electrode that are respectively provided along sidewalls of the insulation layers and electrically connected to at least one of the internal electrodes.

8. The low frequency vibrating actuator device of claim 7, wherein each of the insulation layers comprises at least one of PZT, PLZT, PMN-PT, PYN-PT, PIN-PT, ZnO, CdS, AlN, $BaTiO_3$, $PbTiO_3$, $LiNbO_3$, $LiTaO_3$, BNT, PVDF, P(DVF-TrFE), P(VDF-TrFE-CFE), P(VDF-TrFE-CTFE), P(VDF-HFP), PVDF-TFE, PVC, PAN, PPEN, and polyamides.

9. The low frequency vibrating actuator device of claim 1, further comprising:
a protection layer disposed on the vibrating mass part; and
at least one projection disposed on the protection layer.

10. The low frequency vibrating actuator device of claim 9, wherein the projection vertically overlaps the vibrating mass part.

11. The low frequency vibrating actuator device of claim 1, wherein the first spacer and the second spacer each comprises the same material as the first thin-film and are connected to each other in an integrated manner.

12. The low frequency vibrating actuator device of claim 1, wherein the low frequency vibrating actuator device has a resonance frequency of about 100 Hz to about 500 Hz.

13. A low frequency vibrating actuator apparatus comprising:
a substrate; and
at least one low frequency vibrating actuator device disposed on the substrate,
wherein the low frequency vibrating actuator device comprises:
an actuator configured to generate a vibration by receiving a voltage;
a first spring structure disposed on the actuator; and
a vibrating mass part disposed on the first spring structure,
wherein the first spring structure comprises:
a first thin-film;
a first spacer disposed between the first thin-film and the actuator; and
a second spacer disposed between the first thin-film and the vibrating mass part,
wherein the first spacer and the second spacer are horizontally offset from each other.

14. The low frequency vibrating actuator apparatus of claim 13, further comprising connection electrodes disposed in the substrate,
wherein a top surface of each of the connection electrodes is exposed from the substrate,
wherein the actuator comprises:
a plurality of insulation layers that are laminated with each other;
internal electrodes that are alternately laminated between the insulation layers adjacent to each other; and
a first side electrode and a second side electrode that are respectively provided along sidewalls of the insulation layers and electrically connected to at least one of the internal electrodes,
wherein each of the connection electrodes is electrically connected to one of the first side electrode and the second side electrode.

15. The low frequency vibrating actuator apparatus of claim 13, wherein the low frequency vibrating actuator device comprises a plurality of low frequency vibrating actuator devices and further comprises a protection layer disposed on the low frequency vibrating actuator devices.

16. The low frequency vibrating actuator apparatus of claim 15, further comprising at least one projection disposed on the protection layer,
wherein the projection vertically overlaps the vibrating mass part.

17. The low frequency vibrating actuator apparatus of claim 13, further comprising:
a vibrating layer disposed below the actuator; and
a support disposed between the vibrating layer and the substrate.

18. The low frequency vibrating actuator apparatus of claim 13, wherein the first spacer is disposed adjacent to one side surface of the first thin-film, and
the second spacer is disposed adjacent to the other side surface of the first thin-film.

19. The low frequency vibrating actuator apparatus of claim 18, wherein the first spring structure comprises:
a second thin-film disposed between the second spacer and the vibrating mass part; and
a third thin-film disposed between the first spacer and the actuator.

20. The low frequency vibrating actuator apparatus of claim 13, wherein the low frequency vibrating actuator device further comprises a second spring structure disposed on the vibrating mass part,
wherein the second spring structure comprises:
a second thin film;
a third spacer disposed on a top surface of the second thin film and adjacent to one side surface of the second thin film; and
a fourth spacer disposed on a bottom surface of the second thin film and adjacent to the other side surface of the second thin film.

* * * * *